(12) United States Patent
Takeuchi

(10) Patent No.: US 12,212,303 B2
(45) Date of Patent: Jan. 28, 2025

(54) ACOUSTIC WAVE FILTER AND MULTIPLEXER

(71) Applicant: Murata Manufacturing Co., Ltd., Nagaokakyo (JP)

(72) Inventor: Yuta Takeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 514 days.

(21) Appl. No.: 17/565,507

(22) Filed: Dec. 30, 2021

(65) Prior Publication Data

US 2022/0123717 A1    Apr. 21, 2022

Related U.S. Application Data

(63) Continuation of application No. PCT/JP2020/025500, filed on Jun. 29, 2020.

(30) Foreign Application Priority Data

Jul. 1, 2019  (JP) .................................. 2019-123073

(51) Int. Cl.
   *H03H 9/13*    (2006.01)
   *H03H 9/60*    (2006.01)
   *H03H 9/70*    (2006.01)

(52) U.S. Cl.
   CPC .............. *H03H 9/13* (2013.01); *H03H 9/605* (2013.01); *H03H 9/703* (2013.01)

(58) Field of Classification Search
   CPC ...... H03H 9/605; H03H 9/703; H03H 9/0274; H03H 9/14526; H03H 9/725;
   (Continued)

(56) References Cited

U.S. PATENT DOCUMENTS

| | | | |
|---|---|---|---|
| 6,476,691 B1 | 11/2002 | Tsuzuki et al. | |
| 11,444,598 B2 * | 9/2022 | Maeda | H03H 9/6483 |

(Continued)

FOREIGN PATENT DOCUMENTS

| | | | | |
|---|---|---|---|---|
| CN | 114008917 A | * | 2/2022 | ............... H03H 9/13 |
| JP | 04-207616 A | | 7/1992 | |

(Continued)

OTHER PUBLICATIONS

Translation of JP-2011040817-A (Year: 2011).*
Official Communication issued in International Patent Application No. PCT/JP2020/025500, mailed on Aug. 25, 2020.

*Primary Examiner* — Daniel Pihulic
(74) *Attorney, Agent, or Firm* — Keating & Bennett, LLP

(57) ABSTRACT

An acoustic wave filter includes a divided resonator group and series arm resonators in a path connecting an input-output terminal and an input-output terminal to each other and parallel arm resonators each between a node in the path described above and the ground. The divided resonator group, the series arm resonators, and the parallel arm resonators each include an acoustic wave resonator including an interdigital transducer electrode on a piezoelectric substrate. The divided resonator group includes divided resonators coupled in series with each other. The IDT electrode included in the divided resonator includes a first withdrawal electrode. The IDT electrode included in the divided resonator includes a second withdrawal electrode different from the first withdrawal electrode with respect to the electrode finger structure.

19 Claims, 12 Drawing Sheets

(58) Field of Classification Search
CPC ........ H03H 9/6483; H03H 9/145; H03H 9/64; H03H 9/72; H03H 9/14541; H03H 9/13
See application file for complete search history.

(56) References Cited

U.S. PATENT DOCUMENTS

| | | |
|---|---|---|
| 11,929,737 B2 * | 3/2024 | Takata ................ H03H 9/02992 |
| 11,962,287 B2 * | 4/2024 | Takeuchi ................. H03H 9/13 |
| 2012/0126913 A1 | 5/2012 | Hara et al. |
| 2019/0036554 A1 | 1/2019 | Ito et al. |
| 2020/0244247 A1 * | 7/2020 | Maeda ................. H03H 9/6483 |
| 2020/0280302 A1 | 9/2020 | Miyamoto |
| 2020/0280303 A1 | 9/2020 | Takamine |
| 2021/0143796 A1 * | 5/2021 | Takata ................ H03H 9/02992 |
| 2022/0123717 A1 * | 4/2022 | Takeuchi ................ H03H 9/703 |
| 2022/0149818 A1 * | 5/2022 | Takeuchi ........... H03H 9/14552 |
| 2023/0412143 A1 * | 12/2023 | Taguchi ................. H03H 9/145 |
| 2024/0080014 A1 * | 3/2024 | Komura ............... H03H 9/1457 |

FOREIGN PATENT DOCUMENTS

| | | | | |
|---|---|---|---|---|
| JP | 2011040817 A * | 2/2011 | ............. | H03H 9/568 |
| WO | WO-0076067 A1 * | 12/2000 | ........... | H03H 9/0076 |
| WO | 2017/131170 A1 | 8/2017 | | |
| WO | 2019/111902 A1 | 6/2019 | | |
| WO | 2019/131530 A1 | 7/2019 | | |
| WO | WO-2021002321 A1 * | 1/2021 | ............... | H03H 9/13 |

* cited by examiner

FIG. 6A ACOUSTIC WAVE RESONATOR 101 WITH FLOATING THINNED ELECTRODE

ACOUSTIC WAVE FILTER AND MULTIPLEXER

CROSS REFERENCE TO RELATED APPLICATIONS

This application claims the benefit of priority to Japanese Patent Application No. 2019-123073 filed on Jul. 1, 2019 and is a Continuation Application of PCT Application No. PCT/JP2020/025500 filed on Jun. 29, 2020. The entire contents of each application are hereby incorporated herein by reference.

BACKGROUND OF THE INVENTION

1. Field of the Invention

The present invention relates to an acoustic wave filter and a multiplexer including the acoustic wave filter.

2. Description of the Related Art

As band pass filters used in radio-frequency circuits of devices including communication devices, acoustic wave filters are in practical use. In view of efficient utilization of the frequency resource for wireless communications, many frequency bands are allocated as communication bands for mobile phones or the like, and as a result, intervals between adjacent frequency bands are relatively narrow. With respect to this allocation of frequency bands, an important performance index of acoustic wave filters is the degree of change (hereinafter referred to as sharpness) of insertion loss during the transition from a pass band to an attenuation band at end portions of the pass band.

International Publication No. 2017/131170 discloses an acoustic wave ladder filter including a plurality of series arm resonators and a plurality of parallel arm resonators. In the acoustic wave ladder filter, at least one of the series arm resonators and the parallel arm resonators includes an interdigital transducer (IDT) electrode provided as a withdrawal electrode. This configuration can improve the sharpness at a pass band.

However, when IDT electrodes partially include a withdrawal electrode to produce a filter with high sharpness as in International Publication No. 2017/131170, a periodic structure based on a withdrawal electrode is provided in addition to a periodic structure based on the pitch of the IDT electrode. This causes the frequency response corresponding to the periodic structure based on the withdrawal electrode to be different from the main-mode frequency response corresponding to the periodic structure based on the pitch of the IDT electrode. The frequency response corresponding to the periodic structure based on the withdrawal electrode appears as spurious signals (ripples) outside the pass band. As a result, problems may arise in which the attenuation characteristic of the acoustic wave filter and the bandpass characteristic of a multiplexer including the acoustic wave filter deteriorate.

SUMMARY OF THE INVENTION

Preferred embodiments of the present invention provide acoustic wave filters each of which achieve a sufficient degree of sharpness at a pass band and reduced spurious signals, and also provide multiplexers each having a low-loss bandpass characteristic.

An acoustic wave filter according to a preferred embodiment of the present invention includes a first input-output terminal and a second input-output terminal, one or more series arm resonant circuits in a path connecting the first input-output terminal and the second input-output terminal, and one or more parallel arm resonant circuits between a node in the path and ground. The one or more series arm resonant circuits and the one or more parallel arm resonant circuits each include an acoustic wave resonator including an interdigital transducer (IDT) electrode on a substrate with piezoelectricity. At least either a first series arm resonant circuit of the one or more series arm resonant circuits or a first parallel arm resonant circuit of the one or more parallel arm resonant circuits includes a divided resonator group including a first acoustic wave resonator and a second acoustic wave resonator coupled in series with each other. The IDT electrode included in the first acoustic wave resonator includes a first withdrawal electrode. The IDT electrode included in the second acoustic wave resonator includes a second withdrawal electrode different from the first withdrawal electrode with respect to electrode finger structure.

Preferred embodiments of the present invention provide acoustic wave filters which each achieve a sufficient degree of sharpness at the pass band and reduced spurious signals and a multiplexer achieving a low-loss bandpass characteristic.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6A is a graph illustrating the impedance characteristic of an acoustic wave resonator including a floating withdrawal electrode when the withdrawal rate changes.

DETAILED DESCRIPTION OF THE PREFERRED EMBODIMENTS

Figure 1:
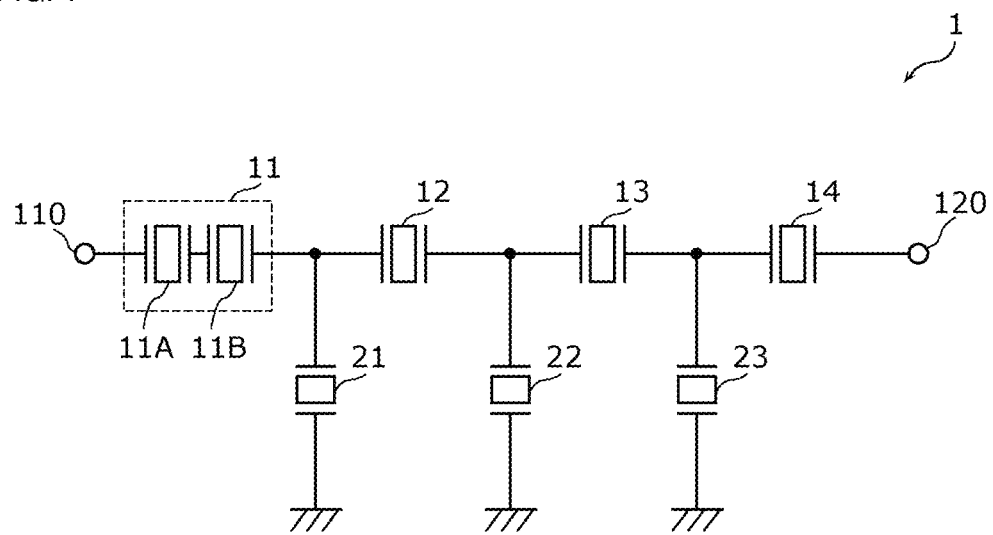
FIG. 1 is a circuit configuration diagram of an acoustic wave filter according to a first preferred embodiment of the present invention.

Hereinafter, preferred embodiments of the present invention will be described in detail with reference to practical examples and the drawings. The preferred embodiments described below are comprehensive or specific examples. Specifics including numerical values, shapes, materials, elements, arrangements of the elements, and connections provided in the following preferred embodiments are merely examples and are not intended to limit the scope of the present invention. Among the elements in the following preferred embodiments, elements not recited in any of the independent claims are described as arbitrary elements. Furthermore, the size or size ratio of the elements illustrated in the drawings is not necessarily presented in an exact manner.

First Preferred Embodiment 1.1 Circuit Configuration of Acoustic Wave Filter 1

FIG. 1 is a circuit configuration diagram of an acoustic wave filter 1 according to a first preferred embodiment of the present invention. As illustrated in FIG. 1, the acoustic wave filter 1 includes a divided resonator group 11, series arm resonators 12, 13, and 14, parallel arm resonators 21, 22, and 23, and input-output terminals 110 and 120.

The series arm resonators 12 to 14 are each an example of a series arm resonant circuit. The series arm resonators 12 to 14 are disposed in a path connecting the input-output terminal 110 (first input-output terminal) and the input-output terminal 120 (second input-output terminal) and coupled in series with each other. The parallel arm resonators 21 to 23 are each an example of a parallel arm resonant circuit. The parallel arm resonators 21 to 23 are each disposed between a node in the path and a ground terminal.

The divided resonator group 11 is an example of a first series arm resonant circuit of the series arm resonant circuits. The divided resonator group 11 is disposed in the path connecting the input-output terminals 110 and 120 and coupled in series with the series arm resonators 12 to 14. The divided resonator group 11 includes divided resonators 11A and 11B coupled in series with each other. The divided resonator 11A is an example of a first acoustic wave resonator. The divided resonator 11B is an example of a second acoustic wave resonator.

The divided resonator group is defined as a resonant circuit that includes a plurality of acoustic wave resonators coupled in series with each other and in which nodes connecting the plurality of acoustic wave resonators are not coupled to any circuit element except the plurality of acoustic wave resonators and also not to the ground.

In other words, the acoustic wave filter 1 includes one or more series arm resonant circuits in the path connecting the input-output terminals 110 and 120 and one or more parallel arm resonant circuits between the nodes in the path described above and the ground. With the configuration described above, the acoustic wave filter 1 defines a band-pass ladder filter.

The divided resonator group 11 is provided to improve the electric power handling capability of the acoustic wave filter 1 and to reduce intermodulation distortion. Because two divided resonators coupled in series with each other define one acoustic wave resonator having capacitive impedance, the area of an interdigital transducer (IDT) electrode can be enlarged. This configuration can reduce the current density of the two divided resonators in comparison to the current density of the one acoustic wave resonator, and thus, it is possible to improve the electric power handling capability of the acoustic wave filter 1 and reduce intermodulation distortion.

The divided resonator group 11 only needs to be provided in the path connecting the input-output terminals 110 and 120 in series with the series arm resonators 12 to 14. This means that the divided resonator group 11 is not necessarily coupled to the input-output terminal 110 as illustrated in FIG. 1. The divided resonator group 11 may be coupled in series among the series arm resonators 12 to 14 or coupled to the input-output terminal 120.

One or more divided resonator groups 11 can be included. As the number of the divided resonator groups 11 included in the acoustic wave filter 1 increases, the electric power handling capability improves and intermodulation distortion decreases.

The series arm resonators 12 to 14 are not necessarily included. The number of included series arm resonators may be four or more, for example. One or more parallel arm resonators can be included.

Elements including circuit elements such as, for example, an inductor and a capacitor and a longitudinally coupled resonator may be inserted among the divided resonator group 11, the series arm resonators 12 to 14, the parallel arm resonators 21 to 23, and the input-output terminals 110 and 120 or between the parallel arm resonators 21 to 23 and the ground.

Figure 2:
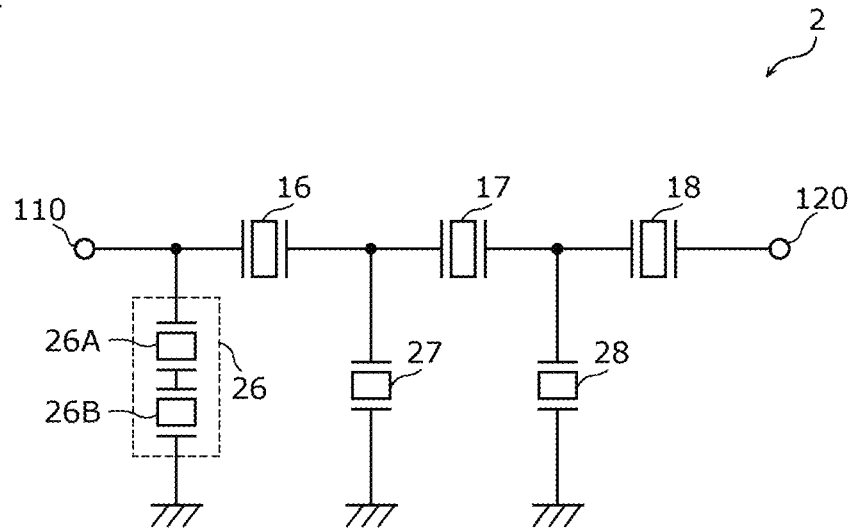
FIG. 2 is a circuit configuration diagram of an acoustic wave filter according to a first modification of the first preferred embodiment of the present invention.

1.2 Circuit Configuration of Acoustic Wave Filter 2 According to First Modification FIG. 2 is a circuit configuration diagram of an acoustic wave filter 2 according to a first modification of the first preferred embodiment. As illustrated in FIG. 2, the acoustic wave filter 2 includes series arm resonators 16, 17, and 18, a divided resonator group 26, parallel arm resonators 27 and 28, and the input-output terminals 110 and 120. The acoustic wave filter 2 according to the present modification differs from the acoustic wave filter 1 according to the first preferred embodiment in that the divided resonator group 26 is provided as a parallel arm resonant circuit, instead of a series arm resonant circuit. Hereinafter, concerning the acoustic wave filter 2 according to the present modification, descriptions of configurations the same or substantially the same as the configurations of the acoustic wave filter 1 according to the first preferred embodiment are not repeated, and different configurations are mainly described.

The series arm resonators 16 to 18 are each an example of the series arm resonant circuit. The series arm resonators 16 to 18 are in a path connecting the input-output terminal 110 (first input-output terminal) and the input-output terminal 120 (second input-output terminal) and coupled in series with each other. The parallel arm resonators 27 and 28 are each an example of the parallel arm resonant circuit. The parallel arm resonators 27 and 28 are each between a node in the path described above and the ground terminal.

The divided resonator group 26 is an example of a first parallel arm resonant circuit of the parallel arm resonant circuits. The divided resonator group 26 is coupled between the input-output terminal 110 and the ground. The divided resonator group 26 includes divided resonators 26A and 26B coupled in series with each other. The divided resonator 26A is an example of the first acoustic wave resonator. The divided resonator 26B is an example of the second acoustic wave resonator.

In other words, the acoustic wave filter 2 includes one or more series arm resonant circuits in the path connecting the input-output terminals 110 and 120 and one or more parallel arm resonant circuits between the nodes in the path described above and the ground. With the configuration described above, the acoustic wave filter 2 defines a band-pass ladder filter.

The divided resonator group 26 only needs to be coupled between the path connecting the input-output terminals 110 and 120 and the ground. This means that the divided resonator group 26 is not necessarily coupled to the input-output terminal 110 as illustrated in FIG. 2. The divided resonator group 26 may be coupled between any node among the series arm resonators 16 to 18 and the ground or between the input-output terminal 120 and the ground.

The divided resonator group 26 is provided to improve the electric power handling capability of the acoustic wave filter 2 and to reduce intermodulation distortion. Because two divided resonators coupled in series with each other define one capacitive acoustic wave resonator, the area of an IDT electrode can be enlarged. This configuration can reduce the current density of the two divided resonators in comparison to the current density of the one acoustic wave resonator, and thus, it is possible to improve the electric power handling capability of the acoustic wave filter 2 and reduce intermodulation distortion.

One or more divided resonator groups 26 can be included. As the number of the divided resonator groups 26 included in the acoustic wave filter 2 increases, the electric power handling capability improves and intermodulation distortion decreases.

The parallel arm resonators 27 and 28 are not necessarily included. The number of included parallel arm resonators may be three or more, for example. One or more series arm resonators can be included.

Elements including circuit elements such as, for example, an inductor and a capacitor and a longitudinally coupled resonator may be inserted among the divided resonator group 26, the series arm resonators 16 to 18, the parallel arm resonators 27 and 28, and the input-output terminals 110 and 120 or between the divided resonator group 26 and the parallel arm resonators 27 and 28 and the ground.

The following is a description of a basic structure of series arm resonant circuits and parallel arm resonant circuits of the acoustic wave filter 1 or 2.

1.3 Structure of Acoustic Wave Resonator

Figure 3A:
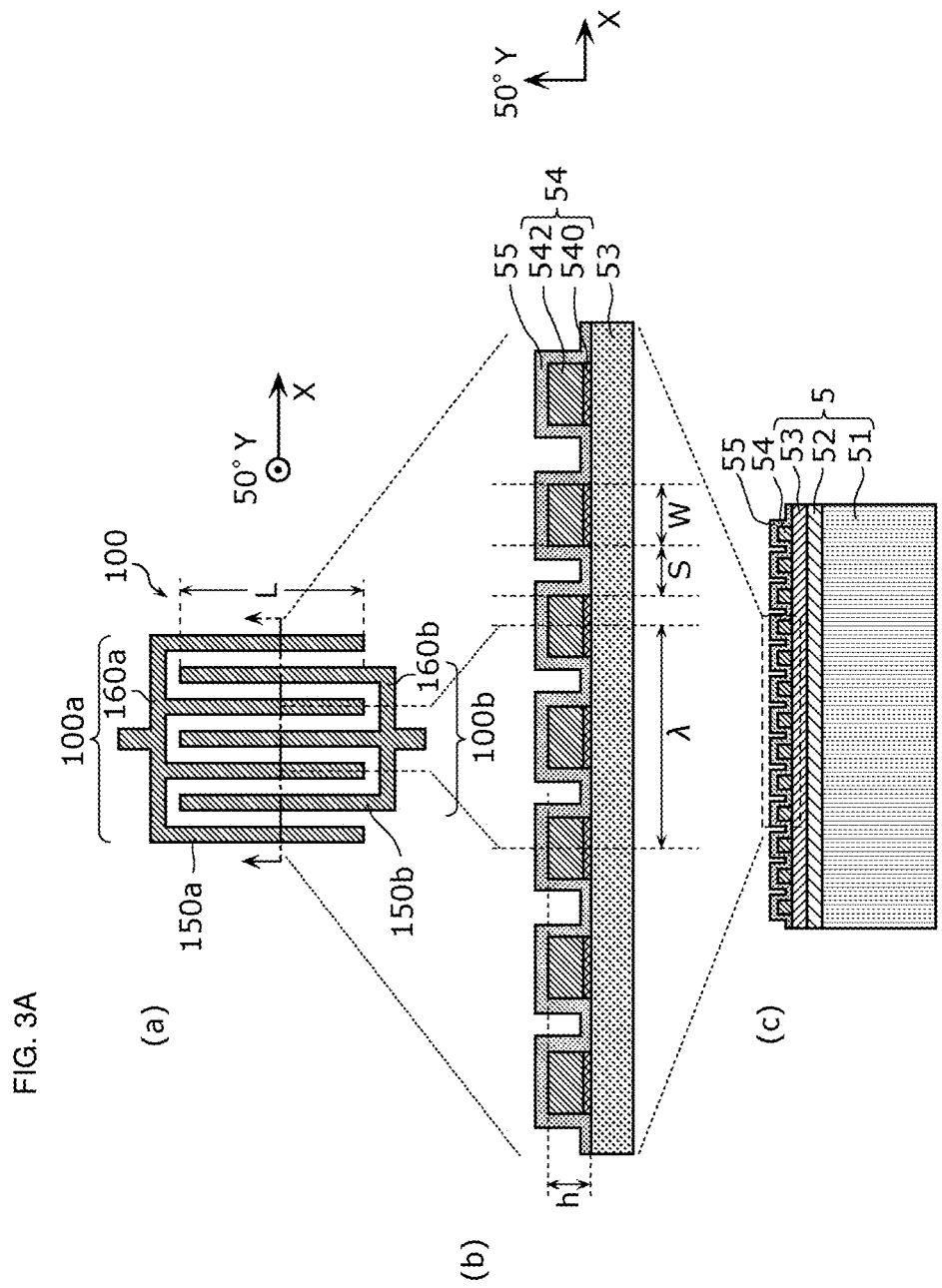
FIG. 3A are a plan view and sectional views schematically illustrating an example of the acoustic wave resonator according to the first preferred embodiment of the present invention.

FIG. 3A is a diagram schematically illustrating an example of an acoustic wave resonator according to the first preferred embodiment, in which part (a) is a plan view, and parts (b) and (c) are sectional views taken along a dot-dash line illustrated in (a). FIG. 3A illustrates an acoustic wave resonator 100 having a basic structure of the series arm resonators, parallel arm resonators, and divided resonators of the acoustic wave filter 1 or 2. The acoustic wave resonator 100 illustrated in FIG. 3A is used only to explain a typical structure of an acoustic wave resonator, and thus, the number of electrode fingers of an electrode, the length of electrode fingers, and the like are not limited to this instance.

The acoustic wave resonator 100 includes a substrate 5 with piezoelectricity and comb-shaped electrodes 100*a* and 100*b*.

As illustrated in part (a) of FIG. 3A, the comb-shaped electrodes 100*a* and 100*b* facing each other in a pair are provided on the substrate 5. The comb-shaped electrode 100*a* includes a plurality of electrode fingers 150*a* parallel or substantially parallel to each other and a busbar electrode 160*a* connecting the electrode fingers 150*a* to each other. The comb-shaped electrode 100*b* includes a plurality of electrode fingers 150*b* parallel or substantially parallel to each other and a busbar electrode 160*b* connecting the electrode fingers 150*b* to each other. The electrode fingers 150*a* and 150*b* extend in a direction perpendicular or substantially perpendicular to the propagation direction of acoustic waves (X-axis direction).

An interdigital transducer (IDT) electrode 54 including the electrode fingers 150*a* and 150*b* and the busbar electrodes 160*a* and 160*b* has a layered structure of a fixing layer 540 and a main electrode layer 542 as illustrated in part (b) of FIG. 3A.

The fixing layer 540 improves the firmness of the substrate 5 and the main electrode layer 542 and, for example, Ti is used as a material. The thickness of the fixing layer 540 is, for example, about 12 nm.

As a material of the main electrode layer 542, for example, Al including about 1% Cu is used. The layer thickness of the main electrode layer 542 is, for example, about 162 nm.

A protective layer 55 covers the comb-shaped electrodes 100*a* and 100*b*. The protective layer 55 protects the main electrode layer 542 from the external environment, controls the frequency temperature characteristics, increases moisture resistance, and the like. The protective layer 55 is, for example, a dielectric film mainly including silicon dioxide. The thickness of the protective layer 55 is, for example, about 25 nm.

Materials of the fixing layer 540, the main electrode layer 542, and the protective layer 55 are not limited to the materials described above. The IDT electrode 54 does not necessarily have the layered structure described above. The IDT electrode 54 may be made of, for example, a metal, such as Ti, Al, Cu, Pt, Au, Ag, or Pd, or an alloy thereof, or may include a plurality of multilayer bodies made of the metal or the alloy. Additionally, the protective layer 55 is not necessarily provided.

Next, a layered structure of the substrate 5 will be described.

As illustrated in part (c) of FIG. 3A, the substrate 5 includes a high-acoustic-velocity support substrate 51, a low-acoustic-velocity film 52, and a piezoelectric film 53, and has a structure provided by layering the high-acoustic-velocity support substrate 51, the low-acoustic-velocity film 52, and the piezoelectric film 53 in this order.

The piezoelectric film 53 is made of, for example, a 50° Y-cut X-propagation LiTaO3 piezoelectric single crystal or piezoelectric ceramic (a lithium tantalate single crystal or ceramic that is cut at a plane perpendicular or substantially perpendicular to a normal line obtained by rotating an axis about an X-axis as a central axis by about 50° from a Y-axis and in which surface acoustic waves propagate in the X-axis direction). The thickness of the piezoelectric film 53 is, for example, about 600 nm. The material and the cut-angle for a piezoelectric single crystal used for the piezoelectric film 53 are selected as appropriate in accordance with required specifications of individual filters.

The high-acoustic-velocity support substrate 51 is a substrate supporting the low-acoustic-velocity film 52, the piezoelectric film 53, and the IDT electrode 54. The high-acoustic-velocity support substrate 51 is also a substrate configured such that bulk waves in the high-acoustic-velocity support substrate 51 are faster in velocity than acoustic waves such as surface acoustic waves and boundary waves propagating along the piezoelectric film 53. The high-acoustic-velocity support substrate 51 confines surface acoustic waves in a portion provided by layering the piezoelectric film 53 and the low-acoustic-velocity film 52 so that the surface acoustic waves do not leak down below the high-acoustic-velocity support substrate 51. The high-acoustic-velocity support substrate 51 is, for example, a silicon substrate and the thickness of the high-acoustic-velocity support substrate 51 is, for example, about 200 μm.

The low-acoustic-velocity film 52 is a film configured such that bulk waves in the low-acoustic-velocity film 52 are slower in velocity than bulk waves propagating in the piezoelectric film 53. The low-acoustic-velocity film 52 is between the piezoelectric film 53 and the high-acoustic-velocity support substrate 51. This structure and a property of an acoustic wave in which energy is naturally concentrated in low-acoustic-velocity media reduces or prevents leakage of surface acoustic wave energy outside the IDT electrode. The low-acoustic-velocity film 52 is a film mainly made of, for example, silicon dioxide and the thickness of the low-acoustic-velocity film 52 is, for example, about 670 nm.

By providing the layered structure of the substrate 5 described above, the Q factor at a resonant frequency and an anti-resonant frequency can be greatly increased in comparison to conventional structures in which a piezoelectric substrate is used as a single layer. As a result, since an acoustic wave resonator with a relatively high Q factor can be provided, it is possible to provide a filter with low insertion loss by using the acoustic wave resonator.

In the case in which a withdrawal electrode is used in an acoustic wave resonator as described later for the purpose of improving the sharpness at end portions of the pass band of the acoustic wave filter 1 or 2, it is assumed that the Q factor of the acoustic wave resonator is equally decreased. In contrast, the layered substrate structure described above can maintain the Q factor of the acoustic wave resonator 100 at high values. As a result, it is possible to provide the acoustic wave filter 1 or 2 in which the low-loss characteristic in the pass band is maintained.

The high-acoustic-velocity support substrate 51 may have a structure provided by layering a support substrate and a high-acoustic-velocity film configured such that bulk waves propagating in the high-acoustic-velocity film are faster in velocity than acoustic waves such as surface acoustic waves and boundary waves that propagate along the piezoelectric film 53. In this case, examples of a material used for the support substrate include piezoelectric materials, such as sapphire, lithium tantalate, lithium niobate, and quartz-crystal; dielectric materials, such as various ceramics including alumina, magnesia, silicon nitride, aluminum nitride, silicon carbide, zirconia, cordierite, mullite, steatite, and forsterite, and glass; semiconductors, such as silicon and gallium nitride; and resin substrates. The high-acoustic-velocity film can be provided using various high-acoustic-velocity materials including aluminum nitride, aluminum oxide, silicon carbide, silicon nitride, silicon oxynitride, DLC films, or diamond; a medium mainly constituted by the materials mentioned; and a medium mainly including a mixture of the materials mentioned.

Figure 3B:
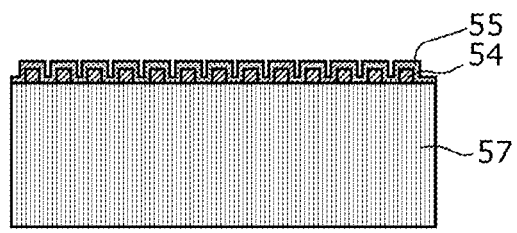
FIG. 3B is a sectional view schematically showing an acoustic wave resonator according to a second modification of the first preferred embodiment of the present invention.

FIG. 3B is a sectional view schematically of an acoustic wave resonator according to a second modification of the first preferred embodiment. While the acoustic wave resonator 100 illustrated in FIG. 3A is described with an example in which the IDT electrode 54 is provided on the substrate 5 including the piezoelectric film 53, the substrate on which the IDT electrode 54 is provided can be a piezoelectric single-crystal substrate 57 including a single layer of a piezoelectric layer as illustrated in FIG. 3B. The piezoelectric single-crystal substrate 57 is, for example, a LiNbO3 piezoelectric single crystal. The acoustic wave resonator 100 according to the present modification includes the LiNbO3 piezoelectric single-crystal substrate 57, the IDT electrode 54, and the protective layer 55 on the IDT electrode 54 above the piezoelectric single-crystal substrate 57.

Concerning the piezoelectric film 53 and the piezoelectric single-crystal substrate 57 described above, the layered structure, the material, the cut-angle, and the thickness can be changed as appropriate in accordance with, for example, the required bandpass characteristics of the acoustic wave filter device. The acoustic wave resonator 100 including a LiTaO3 piezoelectric substrate with a cut-angle other than the cut-angle described above can achieve the same or substantially the same advantageous effects as those of the acoustic wave resonator 100 including the piezoelectric film 53 described above.

The substrate on which the IDT electrode 54 is provided may have a structure provided by layering a support substrate, an energy confining layer, and a piezoelectric film in thus order. The IDT electrode 54 is on the piezoelectric film. As the piezoelectric film, for example, LiTaO3 piezoelectric single crystal or a piezoelectric ceramic may be used. The support substrate supports the piezoelectric film, the energy confining layer, and the IDT electrode 54.

The energy confining layer includes a single layer or a plurality of layers. The velocity of the bulk acoustic wave propagating in at least one layer of the layers is larger than the velocity of the acoustic wave propagating close to the piezoelectric film. For example, the energy confining layer may have a layered structure including a low-acoustic-velocity layer and a high-acoustic-velocity layer. The acoustic velocity of the bulk wave in the low-acoustic-velocity layer is lower than the acoustic velocity of the acoustic wave propagating in the piezoelectric film. The acoustic velocity of the bulk wave in the high-acoustic-velocity layer is higher than the acoustic velocity of the acoustic wave propagating in the piezoelectric film. The support substrate may be a high-acoustic-velocity layer.

The energy confining layer may be an acoustic-impedance layer provided by alternately layering a low-acoustic-impedance layer with a relatively low acoustic impedance and a high-acoustic-impedance layer with a relatively high acoustic impedance.

Here, an example (practical example) of electrode parameters for the IDT electrode of the acoustic wave resonator 100 is described.

The wavelength of acoustic wave resonator is defined as a wavelength λ that is the repetition cycle of the electrode fingers 150a or 150b of the IDT electrode 54 illustrated in part (b) of FIG. 3A. The electrode pitch is about ½ of the wavelength λ and defined as (W+S), where the line width of the electrode fingers 150a and 150b of the comb-shaped electrodes 100a and 100b is W and the space width between an electrode finger 150a and an electrode finger 150b is S. An overlap width L of the comb-shaped electrodes 100a and 100b in a pair is, as illustrated in part (a) of FIG. 3A, the electrode finger length of the overlapping electrode fingers 150a and 150b as viewed in the propagation direction of acoustic waves (X-axis direction). The electrode duty of each acoustic wave resonator is the line width occupancy rate of the electrode fingers 150a and 150b, that is, the rate of the line width to the sum of the line width and the space width of the electrode fingers 150a and 150b, which is defined as W/(W+S). The height of the comb-shaped electrodes 100a and 100b is h. Hereinafter, parameters regarding the shape of the IDT electrode of the acoustic wave resonator such as the wavelength λ, the overlap width L, the electrode duty, and the height h of the IDT electrode 54 are electrode parameters.

1.4 Operation Principle of Acoustic Wave Filter

Next, an operation principle of the acoustic wave ladder filter according to the present preferred embodiment is described.

Figure 4A:
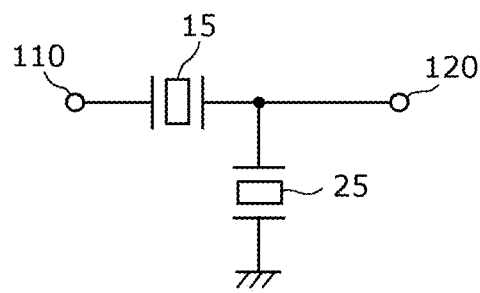
FIGS. 4A and 4B are a circuit configuration diagram for explaining a basic operation principle of an acoustic wave ladder filter and a graph illustrating the frequency characteristic.
Figure 4B:
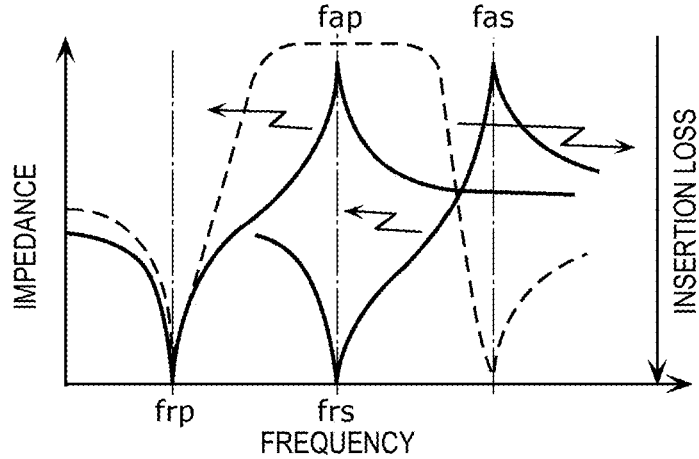

FIGS. 4A and 4B provide a circuit configuration diagram for explaining a basic operation principle of an acoustic wave ladder filter and a graph illustrating the frequency characteristic.

The acoustic wave filter illustrated in FIG. 4A is a basic ladder filter including one series arm resonator 15 and one parallel arm resonator 25. As illustrated in FIG. 4B, the parallel arm resonator 25 has a resonant frequency frp and an anti-resonant frequency fap (>frp) in the resonance characteristic. The series arm resonator 15 has a resonant frequency frs and an anti-resonant frequency fas (>frs>frp) in the resonance characteristic.

When a band pass filter is includes a ladder acoustic wave resonator, the anti-resonant frequency fap of the parallel arm resonator 25 and the resonant frequency frs of the series arm resonator 15 are usually set to be close to each other. In this configuration, the range close to the resonant frequency frp in which the impedance of the parallel arm resonator 25 approaches zero is a low-frequency-side stop band. Furthermore, as frequency increases in this configuration, the impedance of the parallel arm resonator 25 increases in the range close to the anti-resonant frequency fap while the impedance of the series arm resonator 15 approaches zero in the range close to the resonant frequency frs. As a result, the range close to the anti-resonant frequency fap to the resonant frequency frs is a band in which signals pass through the signal path from the input-output terminal 110 to the input-output terminal 120. With this configuration, it is possible to provide a pass band based on the electrode parameters of the acoustic wave resonator and the electromechanical coupling coefficient. As frequency further increases to the range close to the anti-resonant frequency fas, the impedance of the series arm resonator 15 increases, and as a result, the range is a high-frequency-side stop band.

The number of resonance levels defined by parallel arm resonators and series arm resonators is optimized as appropriate in accordance with required specifications. Usually, in the case in which the acoustic wave filter includes a plurality of resonance levels, a plurality of parallel arm resonators are configured to be the same or substantially the same as each other with respect to the anti-resonant frequency fap and a plurality of series arm resonators are configured to be the same or substantially the same as each other with respect to the resonant frequency frs.

In the acoustic wave filter provided by the operation principle described above, when a high frequency signal is inputted from the input-output terminal 110, a potential difference occurs between the input-output terminal 110 and a reference terminal and the piezoelectric layer thus strains, so that a surface acoustic wave propagating in the X-axis direction occurs. Here, by setting the wavelength λ of the IDT electrode 54 and the wavelength of the pass band as the same or substantially the same wavelength, only high frequency signals of desired frequency components pass through the acoustic wave filter.

According to the operation principle described above, as the resonance bandwidth of the series arm resonator 15 that is a frequency difference between the resonant frequency frs and the anti-resonant frequency fas of the series arm resonator 15 and the resonance bandwidth of the parallel arm resonator 25 that is a frequency difference between the resonant frequency frp and the anti-resonant frequency fap of the parallel arm resonator 25 are narrowed, the pass band of the acoustic wave filter is narrowed, and as the two resonance bandwidths are widened, the pass band width of the acoustic wave filter is widened.

According to the operation principle of the basic acoustic wave filter described above, the pass band of the acoustic wave filter 1 according to the present preferred embodiment is determined by controlling the resonant frequency frs and the anti-resonant frequency fas of each of the divided resonators 11A and 11B and the series arm resonators 12 to 14 and the resonant frequency frp and anti-resonant frequency fap of the parallel arm resonators 21 to 23. The pass band of the acoustic wave filter 2 according to the first modification is determined by controlling the resonant frequency frs and anti-resonant frequency fas of each of the series arm resonators 16 to 18 and the divided resonators 26A and 26B and the resonant frequency frp and anti-resonant frequency fap of each of the parallel arm resonators 27 and 28.

In the acoustic wave filter 1 according to the present preferred embodiment, the divided resonator 11A includes a first withdrawal electrode, and the divided resonator 11B includes a second withdrawal electrode different from the first withdrawal electrode with respect to the electrode finger structure. In the acoustic wave filter 2 according to the first modification, the divided resonator 26A includes the first withdrawal electrode, and the divided resonator 26B includes a second withdrawal electrode different from the first withdrawal electrode with respect to the electrode finger structure.

The following describes structure examples of a withdrawal electrode included in the divided resonators 11A, 11B, 26A, and 26B.

1.5 Electrode Finger Structure of Divided Resonator

Hereinafter, structure examples of a withdrawal electrode included in a divided resonator will be described with reference to FIGS. 5A to 5C.

Figure 5A:
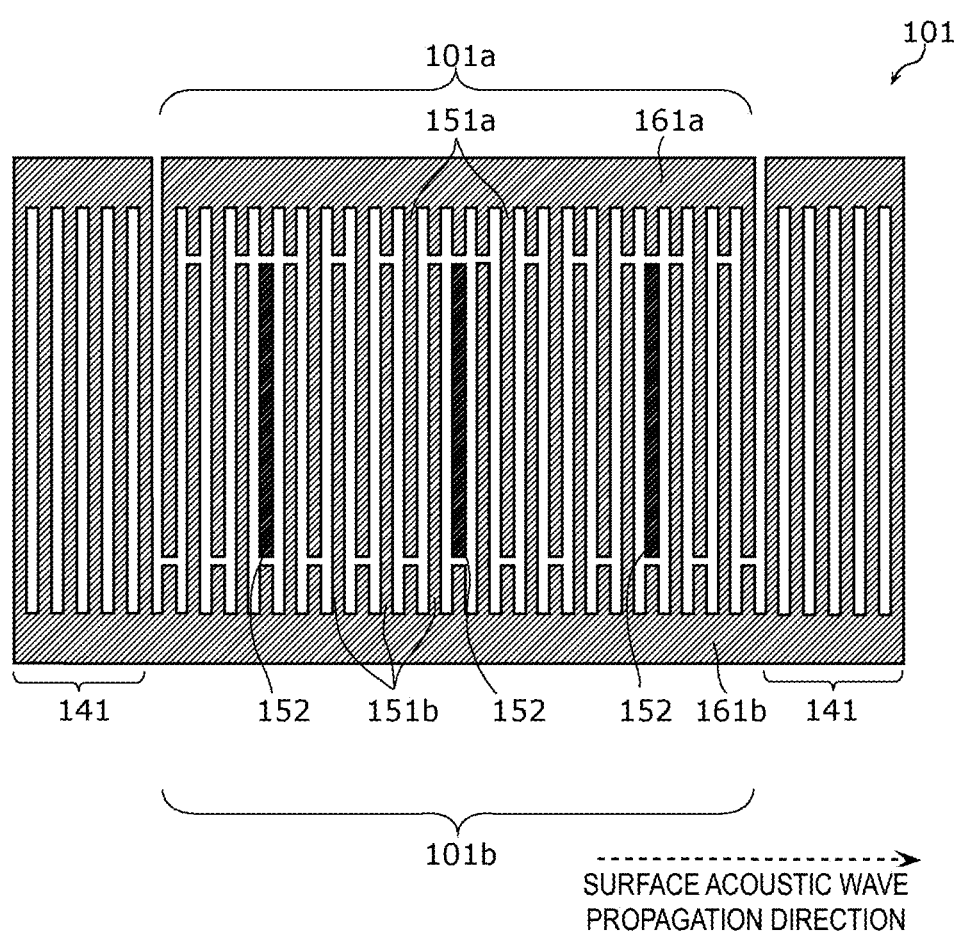
FIG. 5A is a schematic plan view illustrating a structure of an interdigital transducer (IDT) electrode including a floating withdrawal electrode in an acoustic wave filter.

FIG. 5A is a schematic plan view illustrating a structure of an IDT electrode including a floating withdrawal electrode in an acoustic wave filter. FIG. 5B is a schematic plan view illustrating a structure of an IDT electrode including a polarity-inverting withdrawal electrode in an acoustic wave filter. FIG. 5C is a schematic plan view illustrating a structure of an IDT electrode including a filled withdrawal electrode in an acoustic wave filter.

An acoustic wave resonator 101 in FIG. 5A illustrates an example of an electrode finger structure of the first withdrawal electrode or the second withdrawal electrode. FIG. 5A is a schematic plan view illustrating an IDT electrode structure of the acoustic wave resonator 101. The acoustic wave resonator 101 illustrated in FIG. 5A is used only to explain a typical structure of the first withdrawal electrode or the second withdrawal electrode, and thus, the number of electrode fingers of an electrode, the length of electrode fingers, and the like are not limited to this example.

The acoustic wave resonator 101 includes the substrate 5 with piezoelectricity, comb-shaped electrodes 101a and 101b on the substrate 5, and reflectors 141.

As illustrated in FIG. 5A, the comb-shaped electrode 101a includes a plurality of electrode fingers 151a parallel or substantially parallel to each other and a busbar electrode 161a connecting one-side ends of the electrode fingers 151a to each other. The comb-shaped electrode 101b includes a plurality of electrode fingers 151b parallel or substantially parallel to each other and a busbar electrode 161b connecting one-side ends of the electrode fingers 151b to each other. The electrode fingers 151a and 151b extend in a direction perpendicular or substantially perpendicular to the propagation direction of surface acoustic waves (X-axis direction). The comb-shaped electrodes 101a and 101b face each other and the plurality of electrode fingers 151a and 151b are interposed between gaps. This means that the IDT electrode of the acoustic wave resonator 101 includes the comb-shaped electrodes 101a and 101b in a pair.

The comb-shaped electrode 101a includes dummy electrodes positioned in a longitudinal direction of the plurality of electrode fingers 151b to face the plurality of electrode fingers 151b, but the dummy electrodes are not necessarily provided. Moreover, the comb-shaped electrode 101b includes dummy electrodes positioned in a longitudinal direction of the plurality of electrode fingers 151a to face the plurality of electrode fingers 151a, but the dummy electrodes are not necessarily provided. The comb-shaped electrodes 101a and 101b may define a tilted IDT electrode in which the busbar electrodes extend in a direction tilted from the propagation direction of surface acoustic waves or provide a piston structure.

The reflectors 141 include a plurality of electrode fingers parallel or substantially parallel to each other and busbar electrodes connecting the plurality of electrode fingers to each other. The reflectors 141 are positioned on both sides of the pair of the comb-shaped electrodes 101a and 101b.

The IDT electrode including the comb-shaped electrodes 101a and 101b in a pair is, as illustrated in part (b) of FIG. 3A, provided as a layered structure of the fixing layer 540 and the main electrode layer 542, but the structure of the IDT electrode is not limited to the layered structure.

Here, electrode fingers 152 are provided in the IDT electrode of the acoustic wave resonator 101 in a dispersed manner. The electrode fingers 152 define a floating withdrawal electrode in which the electrode fingers 152 are not coupled to either of the busbar electrodes 161a and 161b and positioned in parallel or substantially in parallel with the plurality of electrode fingers 151a and 151b at the same or substantially the same pitch as the plurality of electrode fingers 151a and 151b. The plurality of electrode fingers 151a and 151b are positioned between two adjacent electrode fingers 152. This means that the pitch of the electrode fingers 152 is greater than the pitch of the plurality of electrode fingers 151a and 151b.

The following specifies the withdrawal rate of the IDT electrode including the floating withdrawal electrode. When the number of the electrode fingers 152 in the IDT electrode is M and the number of pairs in the IDT electrode is N in the case in which the IDT electrode is provided by repeatedly disposing the electrode fingers 151a and 151b without providing the electrode fingers 152 in which one electrode finger 151a and one electrode finger 151b adjacent to each other are deemed as a pair, the withdrawal rate of the IDT electrode of the acoustic wave resonator 101 is provided by Expression 1 indicated below.

$$\text{Withdrawal rate}=M/\{2(N-M)+1\} \quad \text{(Expression 1)}$$

Figure 5B:
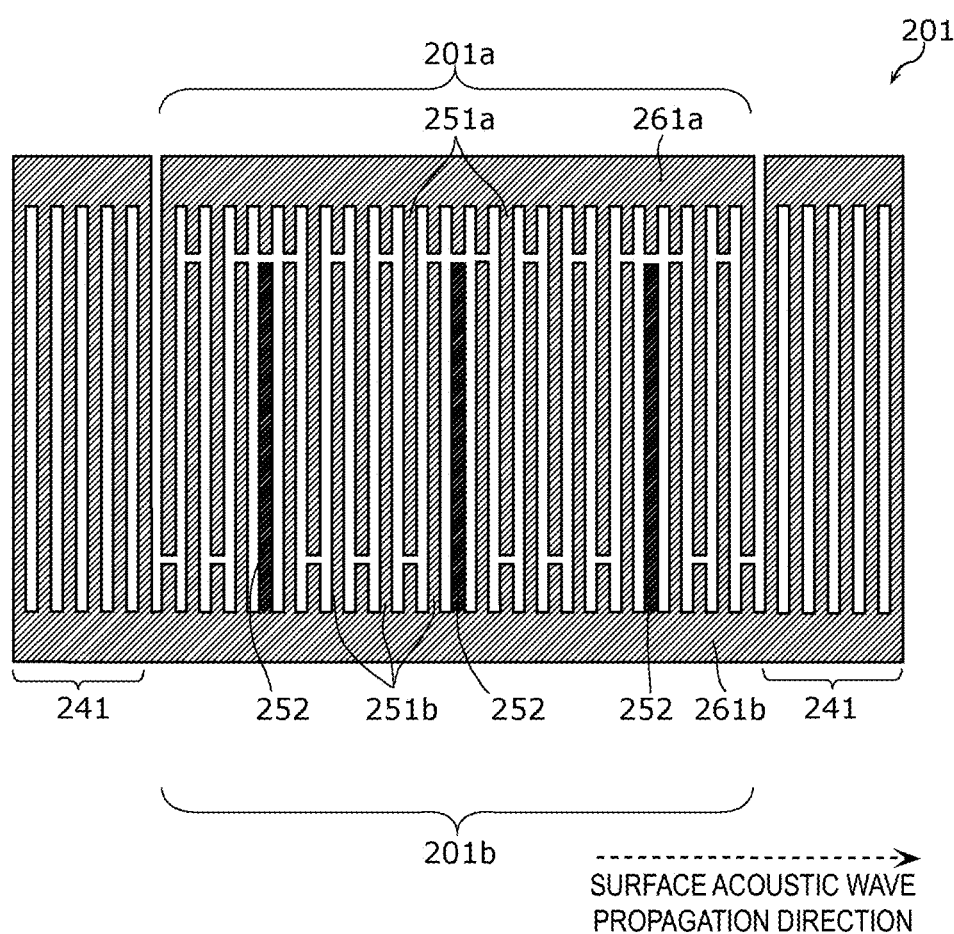
FIG. 5B is a schematic plan view illustrating a structure of an IDT electrode including a polarity-inverting withdrawal electrode in an acoustic wave filter.

An acoustic wave resonator 201 in FIG. 5B illustrates an example of an electrode finger structure of the first withdrawal electrode or the second withdrawal electrode. FIG. 5B is a schematic plan view illustrating an IDT electrode structure of the acoustic wave resonator 201. The acoustic wave resonator 201 illustrated in FIG. 5B is used only to explain a typical structure of the first withdrawal electrode or the second withdrawal electrode, and thus, the number of electrode fingers of an electrode, the length of electrode fingers, and the like are not limited to this instance.

The acoustic wave resonator 201 includes the substrate 5 with piezoelectricity, comb-shaped electrodes 201a and 201b on the substrate 5, and reflectors 241.

As illustrated in FIG. 5B, the comb-shaped electrode 201a includes a plurality of electrode fingers 251a parallel or substantially parallel to each other and a busbar electrode 261a connecting one-side ends of the electrode fingers 251a to each other. The comb-shaped electrode 201b includes a plurality of electrode fingers 251b parallel or substantially parallel to each other and a busbar electrode 261b connecting one-side ends of the electrode fingers 251b to each other. The electrode fingers 251a and 251b extend in a direction perpendicular or substantially perpendicular to the propagation direction of surface acoustic waves (X-axis direction). The comb-shaped electrodes 201a and 201b face each other in a state in which the plurality of electrode fingers 251a and 251b are interposed between gaps. This means that the IDT electrode of the acoustic wave resonator 201 includes the comb-shaped electrodes 201a and 201b in a pair.

The comb-shaped electrode 201a includes dummy electrodes positioned in a longitudinal direction of the plurality of electrode fingers 251b to face the plurality of electrode fingers 251b, but the dummy electrodes are not necessarily provided. Moreover, the comb-shaped electrode 201b includes dummy electrodes positioned in a longitudinal direction of the plurality of electrode fingers 251a to face the plurality of electrode fingers 251a, but the dummy electrodes are not necessarily provided. The comb-shaped electrodes 201a and 201b may define a tilted IDT electrode in which the busbar electrodes extend in a direction tilted from the propagation direction of surface acoustic waves or form a piston structure.

The reflectors 241 include a plurality of electrode fingers parallel or substantially parallel to each other and busbar electrodes connecting the plurality of electrode fingers to each other. The reflectors 241 are positioned on both sides of the pair of the comb-shaped electrodes 201a and 201b.

The IDT electrode defined by the comb-shaped electrodes 201a and 201b in a pair is, as illustrated in part (b) of FIG. 3A, provided as a layered structure of the fixing layer 540 and the main electrode layer 542, but the structure of the IDT electrode is not limited to the layered structure.

Here, electrode fingers 252 are provided in the IDT electrode of the acoustic wave resonator 201 in a dispersed manner. The electrode fingers 252 define a polarity-inverting withdrawal electrode in which the electrode fingers 252 are coupled to the same busbar electrode as the electrode fingers on both sides with respect to each electrode finger 252 of all of the electrode fingers of a pair of the comb-shaped electrodes 201a and 201b. The plurality of electrode fingers 251a and 251b are positioned between two adjacent electrode fingers 252. This means that the pitch of the electrode fingers 252 is greater than the pitch of the plurality of electrode fingers 251a and 251b.

The following specifies the withdrawal rate of the IDT electrode including the polarity-inverting withdrawal electrode. When the number of the electrode fingers 252 in the IDT electrode is M and the number of pairs in the IDT electrode is N in the case in which the IDT electrode is provided by repeatedly disposing the electrode fingers 251a and 251b without providing the electrode fingers 252 in which one electrode finger 251a and one electrode finger 251b adjacent to each other are deemed as a pair, the withdrawal rate of the IDT electrode of the acoustic wave resonator 201 is provided by Expression 1 indicated above.

Figure 5C:
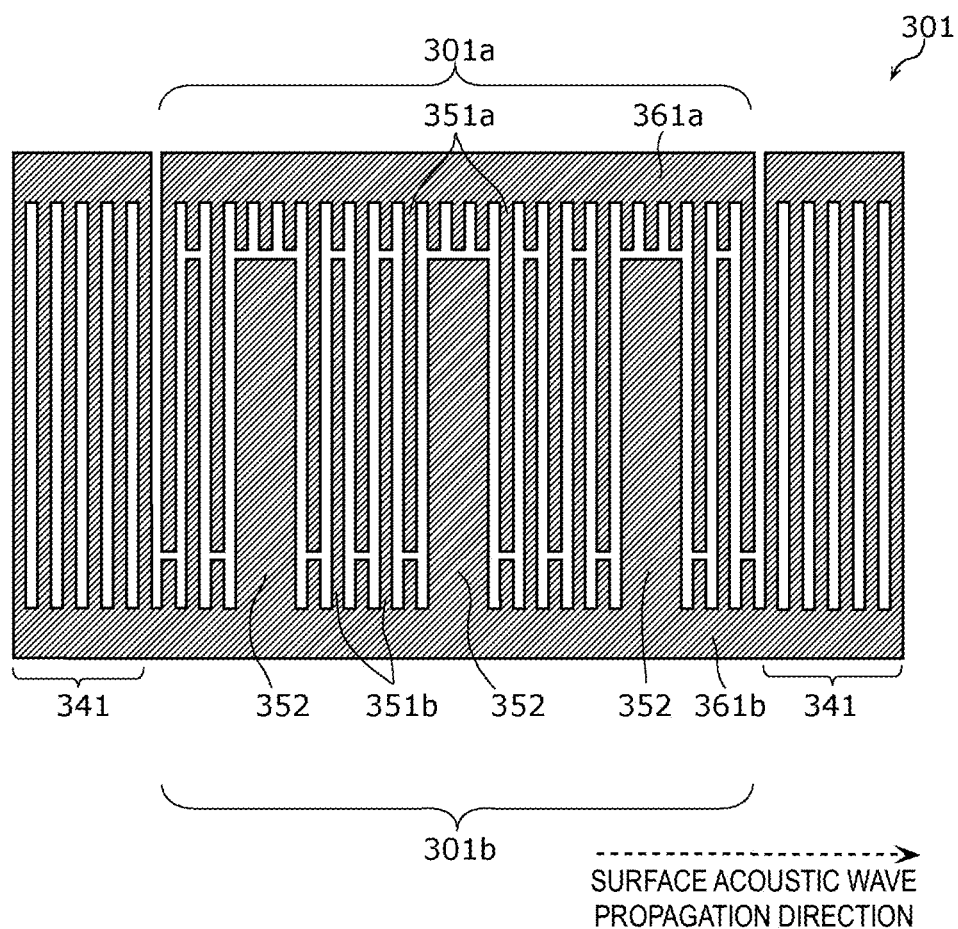
FIG. 5C is a schematic plan view illustrating a structure of an IDT electrode including a filled withdrawal electrode in an acoustic wave filter.
Figure 5C:
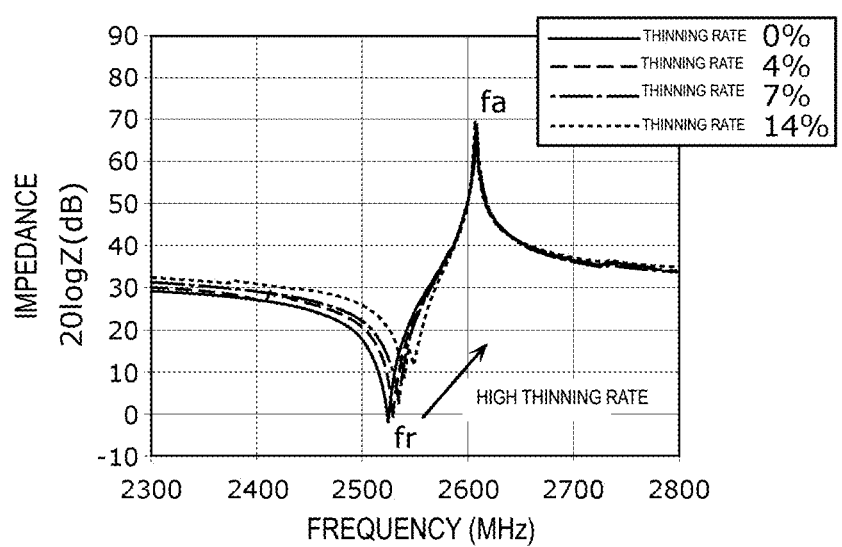

An acoustic wave resonator 301 in FIG. 5C illustrates an example of an electrode finger structure of the first withdrawal electrode or the second withdrawal electrode. FIG. 5C is a schematic plan view illustrating an IDT electrode structure of the acoustic wave resonator 301. The acoustic wave resonator 301 illustrated in FIG. 5C is used only to explain a typical structure of the first withdrawal electrode or the second withdrawal electrode, and thus, the number of electrode fingers of an electrode, the length of electrode fingers, and the like are not limited to this instance.

The acoustic wave resonator 301 includes the substrate with piezoelectricity, comb-shaped electrodes 301a and 301b provided on the substrate 5, and reflectors 341.

As illustrated in FIG. 5C, the comb-shaped electrode 301a includes a plurality of electrode fingers 351a parallel or substantially parallel to each other and a busbar electrode 361a connecting one-side ends of the electrode fingers 351a to each other. The comb-shaped electrode 301b includes a plurality of electrode fingers 351b parallel or substantially parallel to each other and a busbar electrode 361b connecting one-side ends of the electrode fingers 351b to each other. The electrode fingers 351a and 351b extend in a direction perpendicular or substantially perpendicular to the propagation direction of surface acoustic waves (X-axis direction). The comb-shaped electrodes 301a and 301b face each other in a state in which the plurality of electrode fingers 351a and 351b are interposed between gaps. This means that the IDT electrode of the acoustic wave resonator 301 includes the comb-shaped electrodes 301a and 301b in a pair.

The comb-shaped electrode 301a includes dummy electrodes positioned in a longitudinal direction of the plurality of electrode fingers 351b to face the plurality of electrode fingers 351b, but the dummy electrodes are not necessarily provided. Moreover, the comb-shaped electrode 301b includes dummy electrodes positioned in a longitudinal direction of the plurality of electrode fingers 351a to face the plurality of electrode fingers 351a, but the dummy electrodes are not necessarily provided. The comb-shaped electrodes 301a and 301b may define a tilted IDT electrode in which the busbar electrodes extend in a direction tilted from the propagation direction of surface acoustic waves or form a piston structure.

The reflectors 341 include a plurality of electrode fingers parallel or substantially parallel to each other and busbar electrodes connecting the plurality of electrode fingers to each other. The reflectors 341 are positioned on both sides of the pair of the comb-shaped electrodes 301a and 301b.

The IDT electrode including the comb-shaped electrodes 301a and 301b in a pair is, as illustrated in part (b) of FIG. 3A, has a layered structure of the fixing layer 540 and the main electrode layer 542, but the structure of the IDT electrode is not limited to the layered structure.

Here, electrode fingers 352 are provided in the IDT electrode of the acoustic wave resonator 301 in a dispersed manner. The electrode fingers 352 define a filled withdrawal electrode in which the electrode finger width of the electrode fingers 352 is twice or more the average electrode finger width of the electrode fingers except the electrode fingers 352, which is the widest electrode finger width in the IDT electrode of the acoustic wave resonator 301. In other words, the electrode fingers 352 define a filled withdrawal electrode in which one electrode finger is provided by joining adjacent electrode fingers 351a and 351b and the spaces between the adjacent electrode fingers 351a and 351b, the one electrode finger is coupled to the busbar electrode 361a or 361b, and the electrode finger width of the one electrode finger is wider than the plurality of electrode fingers 351a and 351b. The plurality of electrode fingers 351a and 351b are positioned between two adjacent electrode fingers 352. This means that the pitch of the electrode fingers 352 is greater than the pitch of the plurality of electrode fingers 351a and 351b.

The following specifies the withdrawal rate of the IDT electrode including the filled withdrawal electrode. When the number of the electrode fingers 352 in the IDT electrode is M and the number of pairs in the IDT electrode is N in the case in which the IDT electrode is provided by repeatedly disposing the electrode fingers 351a and 351b without providing the electrode fingers 352 in which one electrode finger 351a and one electrode finger 351b adjacent to each other are deemed as a pair, the withdrawal rate of the IDT electrode of the acoustic wave resonator 301 is provided by Expression 1 indicated above.

In the acoustic wave filter 1 according to the present preferred embodiment, the first withdrawal electrode included in the divided resonator 11A is one withdrawal electrode selected from a floating withdrawal electrode, a polarity-inverting withdrawal electrode, and a filled withdrawal electrode. The second withdrawal electrode included in the divided resonator 11B is another withdrawal electrode selected differently from the one withdrawal electrode from a floating withdrawal electrode, a polarity-inverting withdrawal electrode, and a filled withdrawal electrode. This means that the electrode finger structure of the first withdrawal electrode included in the divided resonator 11A is different from the electrode finger structure of the second withdrawal electrode included in the divided resonator 11B. In the acoustic wave filter 1, the IDT electrodes included in the series arm resonators 12 to 14 and the parallel arm resonators 21 to 23 may include withdrawal electrodes.

In the acoustic wave filter 2 according to the first modification, the first withdrawal electrode included in the divided resonator 26A is one withdrawal electrode selected from a floating withdrawal electrode, a polarity-inverting withdrawal electrode, and a filled withdrawal electrode. The second withdrawal electrode included in the divided resonator 26B is another withdrawal electrode selected differently from the one withdrawal electrode from a floating withdrawal electrode, a polarity-inverting withdrawal electrode, and a filled withdrawal electrode. This means that the electrode finger structure of the first withdrawal electrode included in the divided resonator 26A is different from the electrode finger structure of the second withdrawal electrode included in the divided resonator 26B. In the acoustic wave filter 2, the IDT electrodes included in the series arm resonators 16 to 18 and the parallel arm resonators 27 and 28 may include withdrawal electrodes.

Figure 6B:
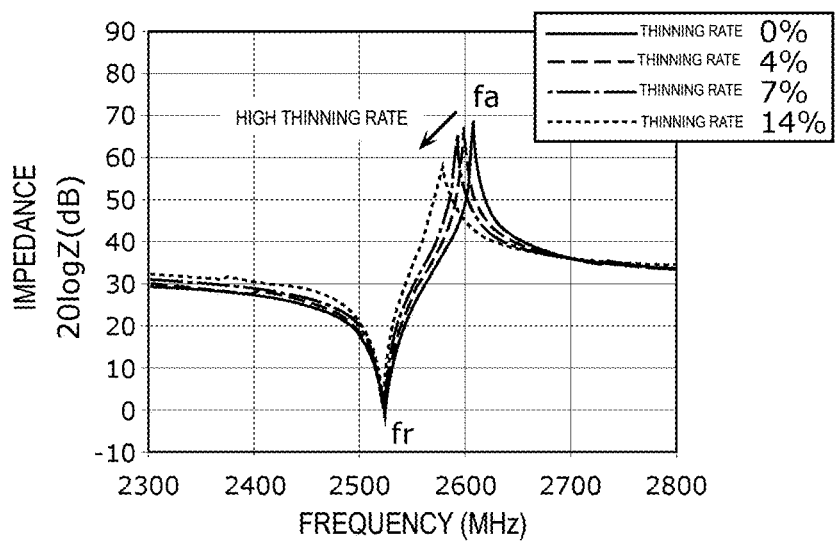
FIG. 6B is a graph illustrating the impedance characteristic of an acoustic wave resonator including a polarity-inverting withdrawal electrode when the withdrawal rate changes.
Figure 6C:
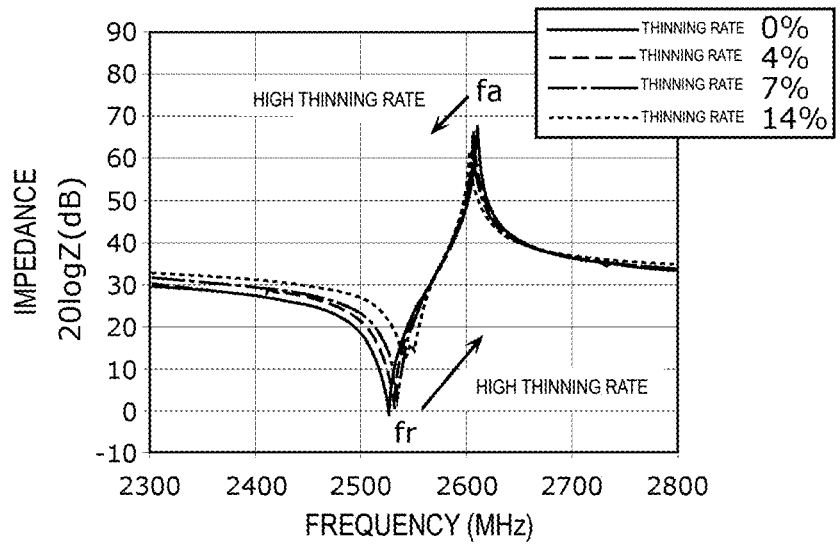
FIG. 6C is a graph illustrating the impedance characteristic of an acoustic wave resonator including a filled withdrawal electrode when the withdrawal rate changes.

1.6 Resonance Characteristic of Acoustic Wave Resonator including Withdrawal Electrode FIG. 6A is a graph illustrating the impedance characteristic of an acoustic wave resonator including a floating withdrawal electrode when the withdrawal rate changes (withdrawal rate: about 0%, about 4%, about 7%, and about 14%). FIG. 6B is a graph illustrating the impedance characteristic of an acoustic wave resonator including a polarity-inverting withdrawal electrode when the withdrawal rate changes (withdrawal rate: about 0%, about 4%, about 7%, and about 14%). FIG. 6C is a graph illustrating the impedance characteristic of an acoustic wave resonator including a filled withdrawal electrode when the withdrawal rate changes (withdrawal rate: about 0%, about 4%, about 7%, and about 14%).

As illustrated in FIG. 6A, the impedance representing a resonance characteristic of the acoustic wave resonator 101 is a minimum value close to zero at a resonant frequency fr and a maximum value close to infinity at an anti-resonant frequency fa. As the withdrawal rate of the floating withdrawal electrode increases, the resonant frequency fr increases to the higher-frequency side. In contrast, changes in the withdrawal rate of the floating withdrawal electrode hardly change the anti-resonant frequency fa. Consequently, as the withdrawal rate of the floating withdrawal electrode increases, the resonance bandwidth that is a frequency difference between the resonant frequency fr and the anti-resonant frequency fa narrows.

As illustrated in FIG. 6B, the impedance representing a resonance characteristic of the acoustic wave resonator 201 is a minimum value close to zero at a resonant frequency fr and a maximum value close to infinity at an anti-resonant frequency fa. Changes in the withdrawal rate of the polarity-inverting withdrawal electrode hardly change the resonant frequency fr. In contrast, as the withdrawal rate of the polarity-inverting withdrawal electrode increases, the anti-resonant frequency fa decreases to the lower-frequency side. Consequently, as the withdrawal rate of the polarity-inverting withdrawal electrode increases, the resonance bandwidth that is a frequency difference between the resonant frequency fr and the anti-resonant frequency fa narrows.

As illustrated in FIG. 6C, the impedance representing a resonance characteristic of the acoustic wave resonator 301 is a minimum value close to zero at a resonant frequency fr and a maximum value close to infinity at an anti-resonant frequency fa. As the withdrawal rate of the filled withdrawal electrode increases, the resonant frequency fr increases to the higher-frequency side. In contrast, as the withdrawal rate of the filled withdrawal electrode increases, the anti-resonant frequency fa decreases to the lower-frequency side. Consequently, as the withdrawal rate of the filled withdrawal electrode increases, the resonance bandwidth that is a frequency difference between the resonant frequency fr and the anti-resonant frequency fa narrows.

As described above, when the electrode finger structure of withdrawal electrode changes, the resonant frequency fr and the anti-resonant frequency fa change in different manners.

1.7 Resonance Characteristic of Divided Resonator Group

Figure 7A:
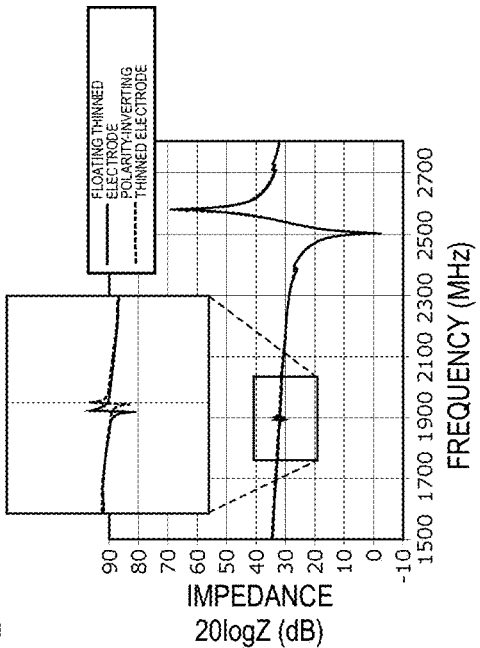
FIGS. 7A to 7D are graphs illustrating the impedance characteristic and reflection characteristic when a floating withdrawal electrode and a polarity-inverting withdrawal electrode are used in a divided resonator group.
Figure 7B:
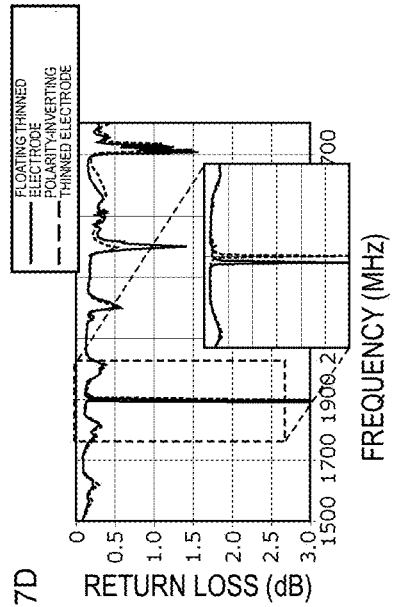
Figure 7C:
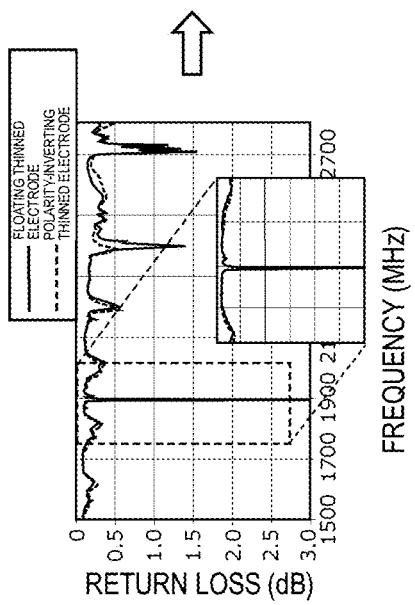
Figure 7D:
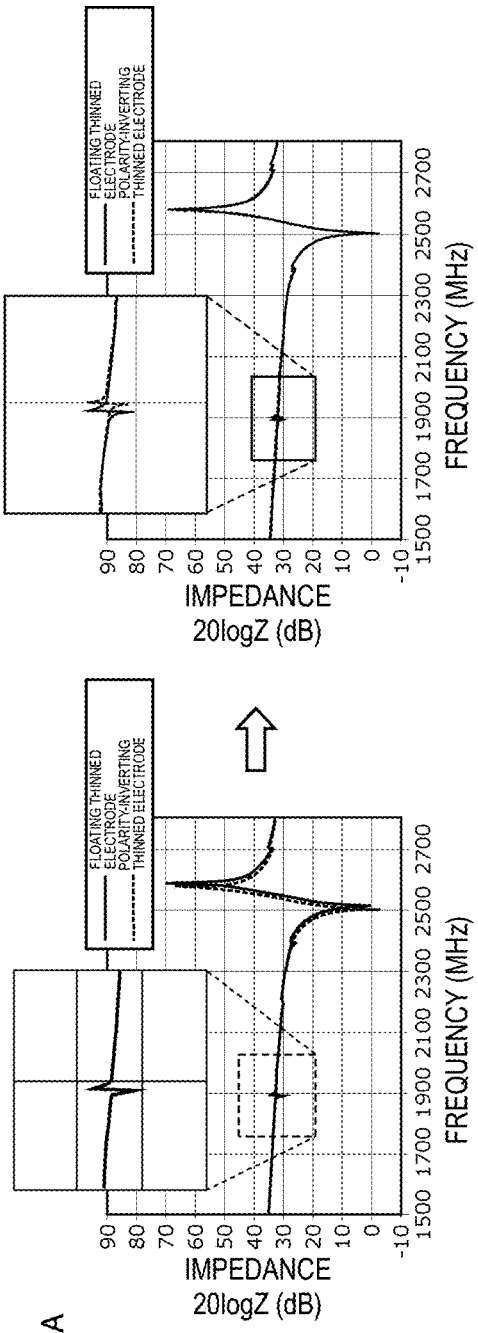

FIGS. 7A to 7D are graphs illustrating the impedance characteristic and reflection characteristic when a floating withdrawal electrode and a polarity-inverting withdrawal electrode are provided in the divided resonator group 11. FIGS. 7A and 7C respectively illustrate the impedance characteristic and reflection characteristic of the divided resonator group 11 in the case in which the divided resonator 11A includes a floating withdrawal electrode (about 7% withdrawal rate), and the divided resonator 11B includes a polarity-inverting withdrawal electrode (about 7% withdrawal rate). FIGS. 7B and 7D respectively illustrate the impedance characteristic and reflection characteristic of the divided resonator group 11 in the case in which the divided resonator 11A includes a floating withdrawal electrode (about 7% withdrawal rate), the divided resonator 11B includes a polarity-inverting withdrawal electrode (about 6% withdrawal rate), and the divided resonators 11A and 11B are the same or substantially the same as each other with respect to the resonant frequency and anti-resonant frequency.

As illustrated in FIG. 7A, in the case in which the divided resonators 11A and 11B are the same or substantially the same as each other with respect to the electrode parameters and different from each other with respect to the electrode finger structure of withdrawal electrode, the floating withdrawal electrode causes the resonant frequency fr of the divided resonator 11A to increase to the higher-frequency side in comparison to the case in which the divided resonator 11A does not include a floating withdrawal electrode. Conversely, the polarity-inverting withdrawal electrode causes the anti-resonant frequency fa of the divided resonator 11B to decrease to the lower-frequency side in comparison to the case in which the divided resonator 11B does not include a polarity-inverting withdrawal electrode. Thus, when the divided resonators 11A and 11B are the same or substantially the same as each other with respect to the electrode parameters, a floating withdrawal electrode is used in the divided resonator 11A, and a polarity-inverting withdrawal electrode is used in the divided resonator 11B, the main resonant mode of the divided resonator 11A is higher in frequency than the main resonant mode of the divided resonator 11B. In this case, for both of the divided resonators 11A and 11B, frequency responses corresponding to a periodic structure based on the withdrawal electrode occur as spurious signals (ripple) outside the pass band (for example, at frequencies close to about 1900 MHz in FIG. 7A). Because in FIG. 7A the divided resonators 11A and 11B are the same or substantially the same as each other with respect to the electrode parameters and withdrawal rate, the divided resonators 11A and 11B are the same or substantially the same as each other also with respect to the frequencies of spurious signals, and this increases ripples generated by adding the spurious signals. Furthermore, as illustrated in FIG. 7C, the return loss in the divided resonator 11A and the return loss in the divided resonator 11B both increase at the frequencies of spurious signals.

In contrast, in FIG. 7B, the divided resonators 11A and 11B are the same or substantially the same as each other with respect to the resonant frequency and anti-resonant frequency in the main resonant mode. The divided resonators 11A and 11B may be the same or substantially the same as each other with respect to the resonant frequency and anti-resonant frequency in the main resonant mode by changing the withdrawal rate. To change the withdrawal rate, the pitch of withdrawal electrode may be changed. For example, by changing the withdrawal rate to set the same or substantially the same resonant frequency and anti-resonant frequency in the main resonant mode, it is possible to provide the divided resonators 11A and 11B to be different from each other with respect to frequencies of spurious signals caused by the periodic structure based on the withdrawal electrode. As a result, because the divided resonators 11A and 11B are different from each other with respect to frequencies of spurious signals, it is possible to reduce ripples generated by adding the spurious signals. Furthermore, as illustrated in FIG. 7D, the return loss in the divided resonator 11A and the return loss in the divided resonator 11B both decreased at the frequencies of spurious signals.

Figure 8A:
FIGS. 8A to 8C provide graphs illustrating the comparison between a divided resonator group according to a first practical example and a divided resonator group according to a first comparative example with respect to the impedance characteristic and the reflection characteristic.
Figure 8B:
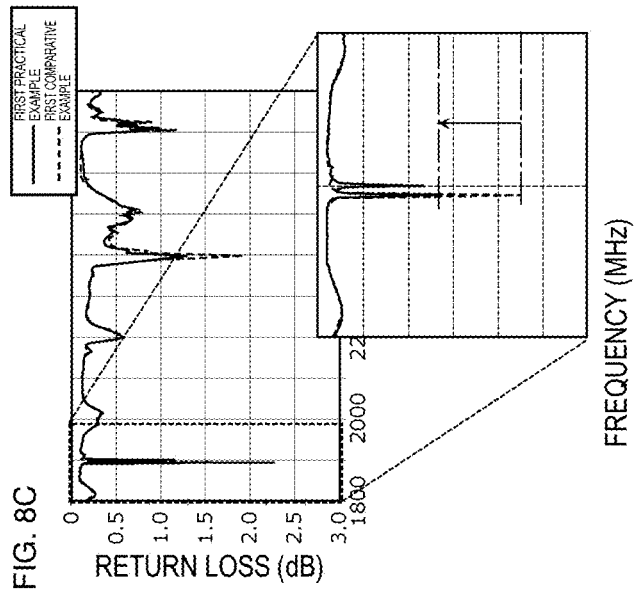
Figure 8C:
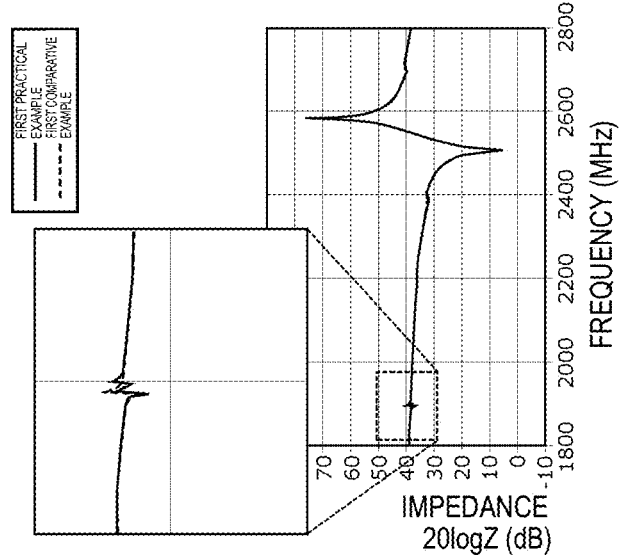

FIGS. 8A and 8B are graphs illustrating the comparison between a divided resonator group according to a first practical example and a divided resonator group according to a first comparative example with respect to the impedance characteristic and the reflection characteristic. FIG. 8A indicates that an acoustic wave filter according to the first practical example the divided resonator 11A includes a floating withdrawal electrode, and the divided resonator 11B includes a polarity-inverting withdrawal electrode; in an acoustic wave filter according to the first comparative example, the divided resonators 11A and 11B each include a floating withdrawal electrode. FIG. 8B illustrates the comparison between the impedance characteristic of the divided resonator group 11 according to the first practical example and the impedance characteristic of the divided resonator group according to the first comparative example. FIG. 8C illustrates the comparison between the reflection characteristic of the divided resonator group 11 according to the first practical example and the reflection characteristic of the divided resonator group according to the first comparative example.

As illustrated in FIG. 8B, in the first comparative example, the divided resonators 11A and 11B are the same or substantially the same as each other with respect to frequencies of spurious signals, and this increases ripples generated by adding the spurious signals. In contrast, in the first practical example, the divided resonators 11A and 11B are different from each other with respect to the electrode finger structure of withdrawal electrode, whereas the divided resonators 11A and 11B are the same or substantially the same as each other with respect to the resonant frequency and anti-resonant frequency in the main resonant mode. As a result, frequencies of spurious signals in the divided resonator 11A are different from frequencies of spurious signals in the divided resonator 11B. As such, in the first practical example, because the divided resonators 11A and 11B are different from each other with respect to frequencies of spurious signals, it is possible to reduce ripples generated by adding the spurious signals. As a result, as illustrated in FIG. 8C, at frequencies of spurious signals (for example, at frequencies close to about 1900 MHz FIG. 8C), the return loss of the divided resonator group of the first practical example is improved to about 1.3 dB, as compared to about 2.3 dB in the first comparative example.

This means that, because withdrawal electrodes are used in the divided resonator group, it is possible to achieve a sufficient degree of sharpness during the transition from both ends of the pass band to attenuation bands and a sufficient degree of capability of handling electric power. At the same time, because the withdrawal electrodes are different from each other among the plurality of divided resonators with respect to the electrode finger structure of withdrawal electrode, it is also possible to reduce ripples based on spurious signals caused outside the pass band.

Figure 9A:
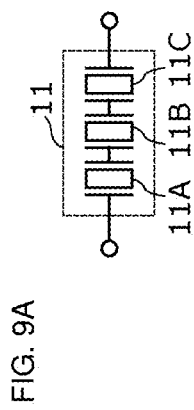
FIGS. 9A to 9C are graphs illustrating the comparison between a divided resonator group according to a second practical example and a divided resonator group according to a second comparative example with respect to the impedance characteristic and the reflection characteristic.
Figure 9B:
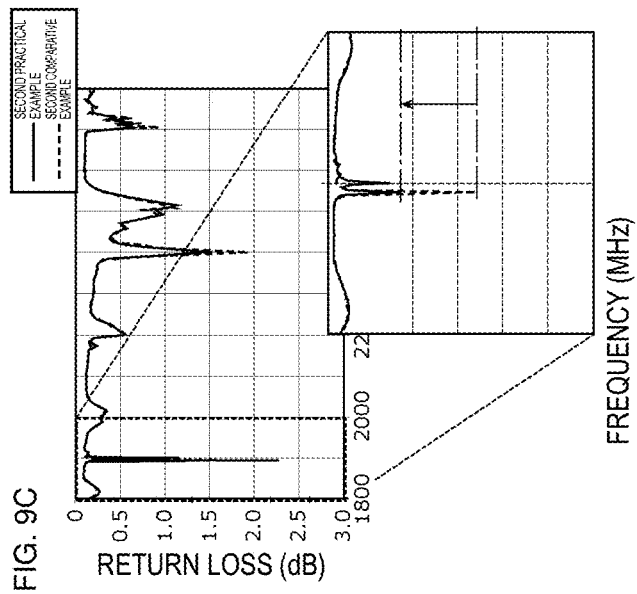
Figure 9C:
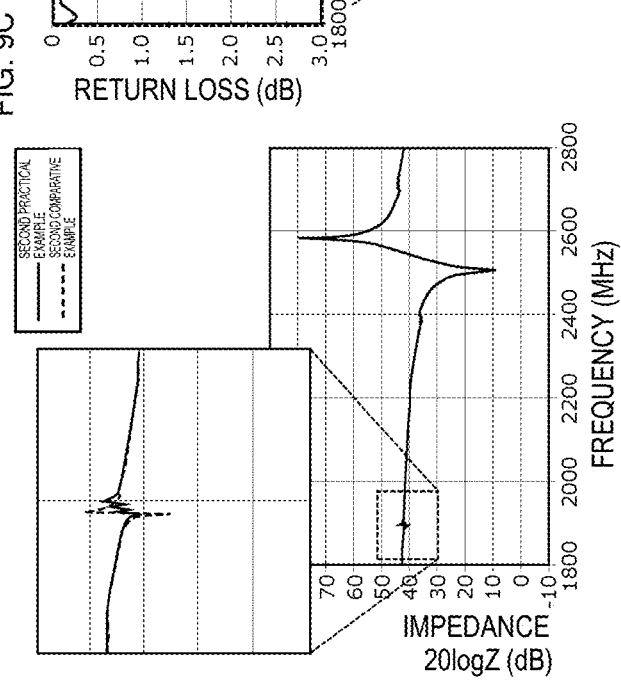

FIGS. 9A and 9B provide graphs illustrating the comparison between a divided resonator group according to a second practical example and a divided resonator group according to a second comparative example with respect to the impedance characteristic and the reflection characteristic. FIG. 9A indicates that the divided resonator group 11 includes three divided resonators 11A, 11B, and 11C coupled in series with each other. FIG. 9A also indicates that in an acoustic wave filter according to the second practical example, the divided resonator 11A includes a floating withdrawal electrode, the divided resonator 11B includes a polarity-inverting withdrawal electrode, and the divided resonator 11C includes a filled withdrawal electrode. In an acoustic wave filter according to the second comparative example, the divided resonators 11A, 11B, and 11C each include a floating withdrawal electrode. FIG. 9B illustrates the comparison between the impedance characteristic of the divided resonator group 11 according to the second practical example and the impedance characteristic of the divided resonator group according to the second comparative example. FIG. 9C illustrates the comparison between the reflection characteristic of the divided resonator group 11 according to the second practical example and the reflection characteristic of the divided resonator group according to the second comparative example.

As illustrated in FIG. 9B, in the second comparative example, the divided resonators 11A, 11B, and 11C are the same or substantially the same as each other with respect to frequencies of spurious signals, and this increases ripples generated by adding the spurious signals. In contrast, in the second practical example, the divided resonators 11A, 11B, and 11C are different from each other with respect to the electrode finger structure of withdrawal electrode, whereas the divided resonators 11A and 11B are the same or substantially the same as each other with respect to the resonant frequency and anti-resonant frequency in the main resonant mode. As a result, frequencies of spurious signals in the divided resonator 11A, frequencies of spurious signals in the divided resonator 11B, and frequencies of spurious signals in the divided resonator 11C are different from each other. As such, in the second practical example, because the divided resonators 11A, 11B, and 11C are different from each other with respect to frequencies of spurious signals, it is possible to reduce ripples generated by adding the spurious signals. As a result, as illustrated in FIG. 9C, at frequencies of spurious signals (for example, at frequencies close to about 1900 MHz in FIG. 9C), the return loss of the divided resonator group of the second practical example is improved to about 0.7 dB, as compared to about 1.6 dB in the second comparative example.

This means that, because withdrawal electrodes are used in the divided resonator group, it is possible to achieve a sufficient degree of sharpness during the transition from both ends of the pass band to attenuation bands and a sufficient degree of capability of handling electric power. At the same time, because the withdrawal electrodes are different from each other among the three divided resonators with respect to the electrode finger structure of withdrawal electrode, it is also possible to reduce ripples based on spurious signals caused outside the pass band.

1.8 Advantageous Effects

The acoustic wave filter 1 according to the present preferred embodiment includes the input-output terminals 110 and 120, one or more series arm resonant circuits (the divided resonator group 11, and the series arm resonators 12, 13, and 14) in the path connecting the input-output terminals 110 and 120, and one or more parallel arm resonant circuits (the parallel arm resonators 21, 22, and 23) between nodes in the path described above and the ground. The one or more series arm resonant circuits and the one or more parallel arm resonant circuits each include the acoustic wave resonator 100 including the IDT electrode 54 on the substrate 5 with piezoelectricity. The divided resonator group 11 of the one or more series arm resonant circuits includes the divided resonators 11A and 11B coupled in series with each other. The IDT electrode included in the divided resonator 11A includes the first withdrawal electrode. The IDT electrode included in the divided resonator 11B includes the second withdrawal electrode different from the first withdrawal electrode with respect to the electrode finger structure.

The acoustic wave filter 2 according to the first modification of the present preferred embodiment includes the input-output terminals 110 and 120, one or more series arm resonant circuits (the series arm resonators 16, 17, and 18) in the path connecting the input-output terminals 110 and 120, and one or more parallel arm resonant circuits (the divided resonator group 26 and the parallel arm resonators 27 and 28) between nodes in the path described above and the ground. The one or more series arm resonant circuits and the one or more parallel arm resonant circuits each include the acoustic wave resonator 100 including the IDT electrode 54 on the substrate 5 with piezoelectricity. The divided resonator group 26 of the one or more parallel arm resonant circuits includes the divided resonators 26A and 26B coupled in series with each other. The IDT electrode included in the divided resonator 26A includes the first withdrawal electrode. The IDT electrode included in the divided resonator 26B includes the second withdrawal electrode different from the first withdrawal electrode with respect to the electrode finger structure.

As a result, the withdrawal electrodes included respectively in the two divided resonators of the divided resonator group are different from each other with respect to the electrode finger structure, and thus, it is possible to provide the two divided resonators to be different (separated away) from each other with respect to frequencies of spurious signals caused outside the pass band due to the withdrawal electrodes. Consequently, it is possible to achieve a sufficient degree of sharpness during the transition from both ends of the pass band to attenuation bands and a sufficient degree of capability of handling electric power and also reduce ripples based on spurious signals caused outside the pass band.

The IDT electrode 54 includes a pair of comb-shaped electrodes each including a plurality of electrode fingers that extend in a direction crossing the propagation direction of acoustic waves and that are in parallel or substantially in parallel with each other and by a busbar electrode that connects one-side ends of electrode fingers of the plurality of electrode fingers to each other. When of the plurality of the electrode fingers 152 that are not coupled to either busbar electrode of the pair of comb-shaped electrodes are determined as a floating withdrawal electrode, of all of the electrode fingers of the pair of comb-shaped electrodes, the electrode fingers 252 coupled to the same busbar electrode as the electrode fingers on both sides with respect to each electrode finger 252 are determined as a polarity-inverting withdrawal electrode, and of the plurality of electrode fingers, the electrode fingers 352 having an electrode finger width that is twice or more the average electrode finger width of the electrode fingers except the electrode fingers and that is the widest electrode finger width are determined as a filled withdrawal electrode, the floating withdrawal electrode, the polarity-inverting withdrawal electrode, and the filled withdrawal electrode are different from each other with respect to the electrode finger structure, the first withdrawal electrode may be one withdrawal electrode selected from the floating withdrawal electrode, the polarity-inverting withdrawal electrode, and the filled withdrawal electrode, and the second withdrawal electrode may be another withdrawal electrode selected differently from the one withdrawal electrode from the floating withdrawal electrode, the polarity-inverting withdrawal electrode, and the filled withdrawal electrode.

With this configuration, the first withdrawal electrode and the second withdrawal electrode are different from each other with respect to the electrode finger structure in the two acoustic wave resonators of the divided resonator group. Consequently, it is possible to achieve a sufficient degree of sharpness during the transition from both ends of the pass band to attenuation bands and a sufficient degree of capability of handling electric power and also reduce ripples based on spurious signals caused outside the pass band.

The first withdrawal electrode may be the floating withdrawal electrode, and the second withdrawal electrode may be the polarity-inverting withdrawal electrode.

This configuration can increase the difference between the frequency difference (resonance bandwidth) between the resonant frequency and anti-resonant frequency of the divided resonator 11A and the resonance bandwidth of the divided resonator 11B. With this configuration, by controlling, for example, the withdrawal rate and withdrawal pitch of the IDT electrode, it is possible to configure the divided resonators 11A and 11B to be the same or substantially the same as each other with respect to the resonant frequency and anti-resonant frequency and also to be greatly different from each other with respect to frequencies of spurious signals caused outside the pass band. Consequently, it is possible to achieve a sufficient degree of sharpness during the transition from both ends of the pass band to attenuation bands and a sufficient degree of capability of handling electric power and also effectively reduce ripples based on spurious signals caused outside the pass band.

When the ratio of the count of electrode fingers of the first withdrawal electrode to the count of electrode fingers of the IDT electrode in the divided resonator 11A is a first withdrawal rate, and the ratio of the count of electrode fingers of the second withdrawal electrode to the count of electrode fingers of the IDT electrode in the divided resonator 11B is a second withdrawal rate, the first withdrawal rate and the second withdrawal rate may be different from each other.

A plurality of divided resonators belonging to one divided resonator group are usually the same or substantially the same as each other with respect to the electrode parameters. However, the divided resonators 11A and 11B are not the same or substantially the same as each other with respect to the resonant frequency and anti-resonant frequency, because the divided resonator 11A including the first withdrawal electrode and the divided resonator 11B including the second withdrawal electrode are different from each other with respect to the electrode finger structure of withdrawal electrode. With this configuration, by setting the first withdrawal rate and the second withdrawal rate to be different from each other, it is possible to configure the divided resonators 11A and 11B to be the same or substantially the same as each other with respect to the resonant frequency and anti-resonant frequency and also to be different from each other with respect to frequencies of spurious signals caused outside the pass band. This configuration can improve or optimize the bandpass characteristic of the acoustic wave filter 1 and reduce ripples based on spurious signals caused outside the pass band.

The first withdrawal electrode may be provided as a periodic structure with a first pitch in the propagation direction of acoustic waves in the IDT electrode, the second withdrawal electrode may be provided as a periodic structure with a second pitch in the propagation direction of acoustic waves in the IDT electrode, and the first pitch and the second pitch may be different from each other.

With this configuration, by setting the first pitch of the first withdrawal electrode in the divided resonator 11A and the second pitch of the second withdrawal electrode in the divided resonator 11B to be different from each other, it is possible to configure the divided resonators 11A and 11B to be the same or substantially the same as each other with respect to the resonant frequency and anti-resonant frequency and also to be different from each other with respect to frequencies of spurious signals caused outside the pass band. This configuration can improve or optimize the bandpass characteristic of the acoustic wave filter and reduce ripples based on spurious signals caused outside the pass band.

Second Preferred Embodiment

The acoustic wave filter 1 according to the first preferred embodiment and the acoustic wave filter 2 according to a modification of the first preferred embodiment can be used in multiplexers. The present preferred embodiment describes a multiplexer including the acoustic wave filter 1 or 2.

Figure 10:
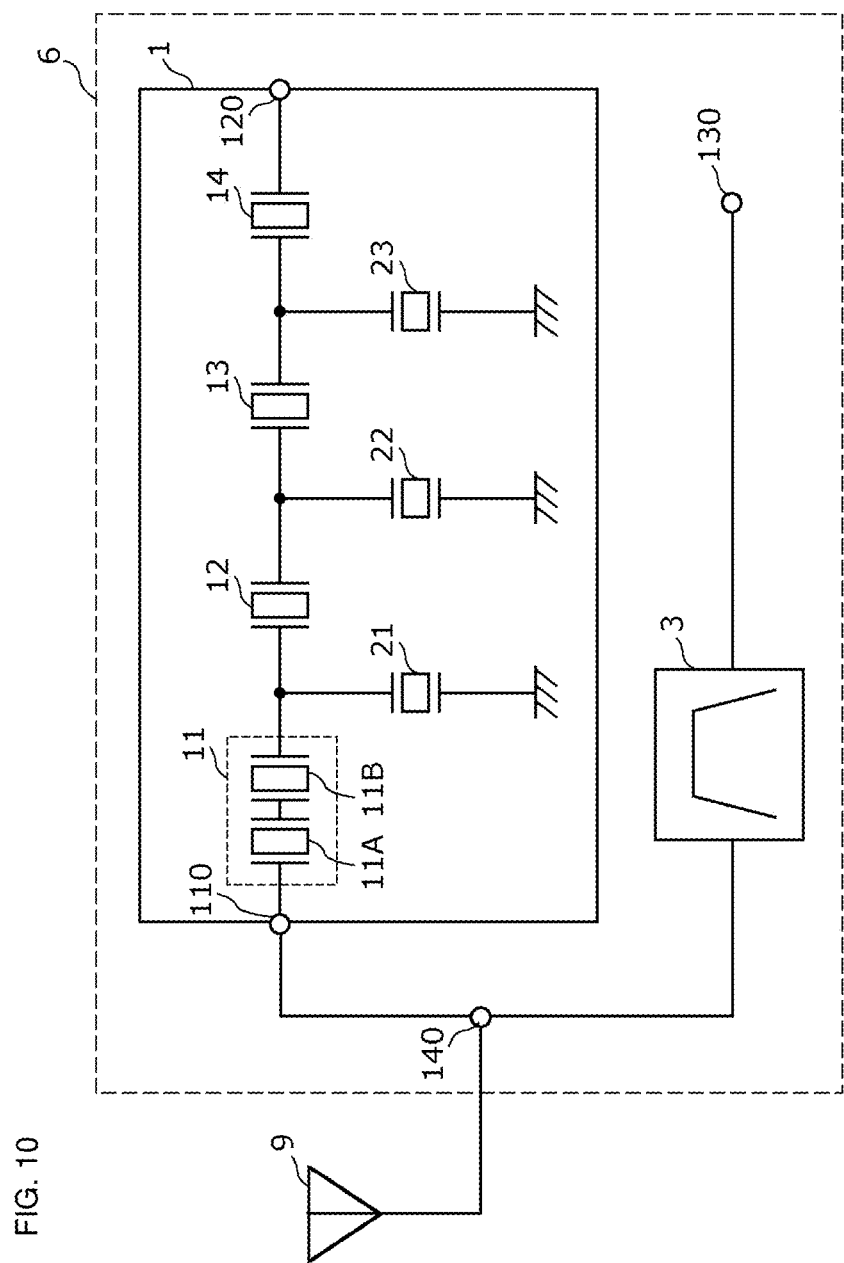
FIG. 10 is a circuit configuration diagram of a multiplexer according to a second preferred embodiment of the present invention.

FIG. 10 is a circuit configuration diagram of the multiplexer 6 according to a second preferred embodiment of the present invention. As illustrated in FIG. 10, the multiplexer 6 includes a common terminal 140, the acoustic wave filter 1, a filter 3, and an input-output terminal 130.

The common terminal 140 is coupled to, for example, an antenna 9.

The acoustic wave filter 1 is coupled to the common terminal 140.

The filter 3 is an example of a first filter. The filter 3 includes a third input-output terminal and a fourth input-output terminal. The pass band of the filter 3 is different from the pass band of the acoustic wave filter 1. The third input-output terminal is coupled to the common terminal 140.

With this configuration, when the pass band of the filter 3 includes spurious signals caused outside the pass band of the acoustic wave filter 1 due to the withdrawal electrodes of acoustic wave resonators of the acoustic wave filter 1, the configuration of the divided resonator group 11 decreases the spurious signals, and thus, it is possible to reduce or prevent increases in the return loss in the pass band of the filter 3 when the acoustic wave filter 1 is viewed from the common terminal 140. This provides the multiplexer 6 in which the acoustic wave filter 1 can achieve a sufficient degree of sharpness during the transition from both ends of the pass band to attenuation bands and a sufficient degree of capability of handling electric power and also reduce ripples based on spurious signals caused outside the pass band and in which the filter 3 can reduce degradation of insertion loss in the pass band.

As illustrated in FIG. 10, the divided resonator group 11 of the acoustic wave filter 1 may be coupled at the closest position of the series arm resonant circuits (series arm resonators) and the parallel arm resonant circuits (parallel arm resonators) to the common terminal 140.

Of the acoustic wave resonators of the acoustic wave filter 1, as an acoustic wave resonator approaches the common terminal 140, the likelihood that signal components of harmonic waves and intermodulation distortion occurring in the acoustic wave resonator degrade the bandpass characteristic of the filter 3 increases.

With the configuration described above, because the divided resonator group 11 capable of reducing the occurrence of signal components of harmonic waves and intermodulation distortion is disposed at the closest position to the common terminal 140, it is possible to reduce degradation of the bandpass characteristic of the filter 3 due to harmonic waves and intermodulation distortion. Additionally, because frequencies of spurious signals caused by the withdrawal electrodes in the divided resonator group 11 are separated away from each other by differently configuring the withdrawal electrodes with respect to the electrode finger structure, it is possible to decrease the return loss due to the spurious signals when the acoustic wave filter 1 is viewed from the common terminal 140. As a result, the acoustic wave filter 1 can achieve a sufficient degree of sharpness during the transition from both ends of the pass band to attenuation bands and a sufficient degree of capability of handling electric power and also reduce ripples based on spurious signals caused outside the pass band, and the filter 3 can reduce degradation of insertion loss in the pass band.

In the multiplexer 6, the acoustic wave filter 1 may be replaced with the acoustic wave filter 2 according to the first modification of the first preferred embodiment.

The multiplexer 6 is provided by coupling two filters (the acoustic wave filter 1 and the filter 3) to the common terminal 140, but the number of filters coupled to the common terminal 140 is not limited to two and may be three or more.

Circuit elements such as, for example, an inductor, a capacitor, a switch, a divider, and a circulator may be inserted between the common terminal 140 and the acoustic wave filter 1 and between the common terminal 140 and the filter 3.

Other Modifications

The acoustic wave filters and multiplexers according to preferred embodiments of the present invention and modifications thereof have been described above, but the acoustic wave filter and multiplexer of the present invention are not limited to the preferred embodiments and modifications described above. The present invention also includes other preferred embodiments including any combination of the elements of the preferred embodiments described above, other modified examples obtained by making various modifications to the preferred embodiments that occur to those skilled in the art without departing from the scope of the present invention, and various hardware devices including the acoustic wave filters and multiplexers of preferred embodiments of the present invention.

The acoustic wave resonators of the acoustic wave filters 1 and 2 according to the preferred embodiments described above may be, for example, the surface acoustic wave (SAW) resonators as described above or bulk acoustic wave (BAW) resonators. It should be noted that SAWs include not only surface waves but also boundary waves.

The filter 3 may be structured as any kind of filter, such as, for example, a SAW filter including a SAW resonator, a BAW filter including a BAW resonator, an LC filter, or a dielectric filter.

Preferred embodiments of the present invention and modifications thereof can be used, for example, as an acoustic wave filter with excellent sharpness that can support multiband and multimode frequency standards, for a wide variety of communication devices, such as mobile phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
a first input-output terminal and a second input-output terminal;
one or more series arm resonant circuits in a path connecting the first input-output terminal and the second input-output terminal; and
one or more parallel arm resonant circuits between a node in the path and ground; wherein
the one or more series arm resonant circuits and the one or more parallel arm resonant circuits each include an acoustic wave resonator including an interdigital transducer (IDT) electrode on a substrate with piezoelectricity;
at least either a first series arm resonant circuit of the one or more series arm resonant circuits or a first parallel arm resonant circuit of the one or more parallel arm resonant circuits includes a divided resonator group including a first acoustic wave resonator and a second acoustic wave resonator coupled in series with each other;
the IDT electrode included in the first acoustic wave resonator includes a first withdrawal electrode; and
the IDT electrode included in the second acoustic wave resonator includes a second withdrawal electrode different from the first withdrawal electrode with respect to electrode finger structure.

2. The acoustic wave filter according to claim 1, wherein
the IDT electrode includes a pair of comb-shaped electrodes each including a plurality of electrode fingers that extend in a direction crossing a propagation direction of acoustic waves and that are in parallel or substantially in parallel with each other and a busbar electrode that connects one-side ends of electrode fingers of the plurality of electrode fingers to each other;
of the plurality of electrode fingers, first electrode fingers that are not coupled to either busbar electrode of the pair of comb-shaped electrodes define a floating withdrawal electrode;
of the plurality of electrode fingers, second electrode fingers coupled to a same busbar electrode as electrode fingers on both sides with respect to each of the second electrode fingers define a polarity-inverting withdrawal electrode;
of the plurality of electrode fingers, third electrode fingers including an electrode finger width that is a widest electrode finger width and that is twice or more of an average electrode finger width of the plurality of electrode fingers, except the third electrode fingers, define a filled withdrawal electrode;
the floating withdrawal electrode, the polarity-inverting withdrawal electrode, and the filled withdrawal electrode have different electrode finger structures from each other;
the first withdrawal electrode is one withdrawal electrode selected from the floating withdrawal electrode, the polarity-inverting withdrawal electrode, and the filled withdrawal electrode; and
the second withdrawal electrode is another withdrawal electrode differently selected than the one withdrawal electrode from the floating withdrawal electrode, the polarity-inverting withdrawal electrode, and the filled withdrawal electrode.

3. The acoustic wave filter according to claim 2, wherein
the first withdrawal electrode is the floating withdrawal electrode; and
the second withdrawal electrode is the polarity-inverting withdrawal electrode.

4. The acoustic wave filter according to claim 2, wherein when a ratio of a number of electrode fingers of the first withdrawal electrode to a number of electrode fingers of the IDT electrode in the first acoustic wave resonator is a first withdrawal rate, and a ratio of a number of electrode fingers of the second withdrawal electrode to a count of electrode fingers of the IDT electrode in the second acoustic wave resonator is a second withdrawal rate, the first withdrawal rate and the second withdrawal rate are different from each other.

5. The acoustic wave filter according to claim 4, wherein
the first withdrawal electrode includes a periodic structure with a first pitch in the propagation direction of acoustic waves in the IDT electrode including the first withdrawal electrode;
the second withdrawal electrode includes a periodic structure with a second pitch in the propagation direction of acoustic waves in the IDT electrode including the second withdrawal electrode; and
the first pitch and the second pitch are different from each other.

6. A multiplexer comprising:
a common terminal;
the acoustic wave filter according to claim 1; and
a first filter including a third input-output terminal and a fourth input-output terminal, a pass band of the first filter being different from a pass band of the acoustic wave filter; wherein
the common terminal is coupled to the first input-output terminal and the third input-output terminal.

7. The multiplexer according to claim 6, wherein at least either the first series arm resonant circuit including the divided resonator group or the first parallel arm resonant circuit including the divided resonator group is coupled at a closest position of the series arm resonant circuits and the parallel arm resonant circuits of the acoustic wave filter to the common terminal.

8. The acoustic wave filter according to claim 1, wherein each of the IDT electrodes includes a fixing layer and a main electrode layer on the fixing layer.

9. The acoustic wave filter according to claim 8, wherein the fixing layer includes Ti.

10. The acoustic wave filter according to claim 8, wherein the main electrode layer includes Al including about 1% Cu.

11. The acoustic wave filter according to claim 2, further comprising a protective layer covering the comb-shaped electrodes.

12. The multiplexer according to claim 6, wherein
the IDT electrode includes a pair of comb-shaped electrodes each including a plurality of electrode fingers that extend in a direction crossing a propagation direction of acoustic waves and that are in parallel or substantially in parallel with each other and a busbar electrode that connects one-side ends of electrode fingers of the plurality of electrode fingers to each other;
of the plurality of electrode fingers, first electrode fingers that are not coupled to either busbar electrode of the pair of comb-shaped electrodes define a floating withdrawal electrode;
of the plurality of electrode fingers, second electrode fingers coupled to a same busbar electrode as electrode fingers on both sides with respect to each of the second electrode fingers define a polarity-inverting withdrawal electrode;

of the plurality of electrode fingers, third electrode fingers including an electrode finger width that is a widest electrode finger width and that is twice or more of an average electrode finger width of the plurality of electrode fingers, except the third electrode fingers, define a filled withdrawal electrode;

the floating withdrawal electrode, the polarity-inverting withdrawal electrode, and the filled withdrawal electrode have different electrode finger structures from each other;

the first withdrawal electrode is one withdrawal electrode selected from the floating withdrawal electrode, the polarity-inverting withdrawal electrode, and the filled withdrawal electrode; and the second withdrawal electrode is another withdrawal electrode differently selected than the one withdrawal electrode from the floating withdrawal electrode, the polarity-inverting withdrawal electrode, and the filled withdrawal electrode.

13. The multiplexer according to claim 12, wherein
the first withdrawal electrode is the floating withdrawal electrode; and
the second withdrawal electrode is the polarity-inverting withdrawal electrode.

14. The multiplexer according to claim 12, wherein when a ratio of a number of electrode fingers of the first withdrawal electrode to a number of electrode fingers of the IDT electrode in the first acoustic wave resonator is a first withdrawal rate, and a ratio of a number of electrode fingers of the second withdrawal electrode to a count of electrode fingers of the IDT electrode in the second acoustic wave resonator is a second withdrawal rate, the first withdrawal rate and the second withdrawal rate are different from each other.

15. The multiplexer according to claim 14, wherein
the first withdrawal electrode includes a periodic structure with a first pitch in the propagation direction of acoustic waves in the IDT electrode including the first withdrawal electrode;
the second withdrawal electrode includes a periodic structure with a second pitch in the propagation direction of acoustic waves in the IDT electrode including the second withdrawal electrode; and
the first pitch and the second pitch are different from each other.

16. The multiplexer according to claim 6, wherein each of the IDT electrodes includes a fixing layer and a main electrode layer on the fixing layer.

17. The multiplexer according to claim 16, wherein the fixing layer includes Ti.

18. The multiplexer according to claim 16, wherein the main electrode layer includes Al including about 1% Cu.

19. The multiplexer according to claim 12, further comprising a protective layer covering the comb-shaped electrodes.

* * * * *